(12) United States Patent
Bae et al.

(10) Patent No.: US 12,033,635 B2
(45) Date of Patent: *Jul. 9, 2024

(54) IMAGE DISPLAY APPARATUS AND METHOD OF CONTROLLING THE SAME

(71) Applicant: SAMSUNG ELECTRONICS CO., LTD., Suwon-si (KR)

(72) Inventors: Dae Gyu Bae, Suwon-si (KR); Tae Hwan Cha, Yongin-si (KR); Ho Jeong You, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/131,895

(22) Filed: Apr. 7, 2023

(65) Prior Publication Data

US 2023/0245653 A1  Aug. 3, 2023

Related U.S. Application Data

(63) Continuation of application No. 17/167,588, filed on Feb. 4, 2021, now Pat. No. 11,763,812, which is a
(Continued)

(30) Foreign Application Priority Data

Jan. 9, 2012 (KR) .................. 10-2012-0002659
Dec. 11, 2012 (KR) .................. 10-2012-0143590

(51) Int. Cl.
*G10L 15/22* (2006.01)
*G10L 15/08* (2006.01)
(Continued)

(52) U.S. Cl.
CPC ............. *G10L 15/22* (2013.01); *G10L 15/08* (2013.01); *G10L 15/26* (2013.01); *G10L 17/22* (2013.01);
(Continued)

(58) Field of Classification Search
USPC .................. 704/246, 247, 251, 252, 275
See application file for complete search history.

(56) References Cited

U.S. PATENT DOCUMENTS 5,220,595 A  6/1993 Uehara
5,774,859 A  6/1998 Houser et al.
(Continued)

FOREIGN PATENT DOCUMENTS

CN  1298173 A  6/2001
CN  1319223 A  10/2001
(Continued)

OTHER PUBLICATIONS

Communication dated Oct. 17, 2022 issued by the National Intellectual Property Administration, PRC, in counterpart Chinese Application No. 201910653311.0.
(Continued)

*Primary Examiner* — Leonard Saint-Cyr
(74) *Attorney, Agent, or Firm* — Sughrue Mion, PLLC

(57) ABSTRACT

Provided are an image display apparatus and a method of controlling the same. The image display apparatus enabling voice recognition includes: a first voice inputter which receives a user-side audio signal; an audio outputter which outputs an audio signal processed by the image display apparatus; a first voice recognizer which recognizes the user-side audio signal received through the first voice inputter; and a controller which decreases a volume of the audio signal output through the audio outputter to a predetermined level if a voice recognition start command is received.

30 Claims, 19 Drawing Sheets

Related U.S. Application Data continuation of application No. 16/569,849, filed on Sep. 13, 2019, now Pat. No. 10,957,323, which is a continuation of application No. 15/722,416, filed on Oct. 2, 2017, now abandoned, which is a continuation of application No. 15/351,500, filed on Nov. 15, 2016, now Pat. No. 9,786,278, which is a continuation of application No. 14/678,556, filed on Apr. 3, 2015, now Pat. No. 9,530,418, which is a continuation of application No. 13/737,683, filed on Jan. 9, 2013, now Pat. No. 9,401,149.

(51) Int. Cl.
| | |
|---|---|
| G10L 15/26 | (2006.01) |
| G10L 17/22 | (2013.01) |
| G10L 21/00 | (2013.01) |
| H03G 3/02 | (2006.01) |
| H03G 3/30 | (2006.01) |
| H04N 21/422 | (2011.01) |
| H04N 21/431 | (2011.01) |
| H04N 21/439 | (2011.01) |

(52) U.S. Cl.
CPC .............. *G10L 21/00* (2013.01); *H03G 3/02* (2013.01); *H03G 3/3005* (2013.01); *H04N 21/42203* (2013.01); *H04N 21/42204* (2013.01); *H04N 21/4221* (2013.01); *H04N 21/42222* (2013.01); *H04N 21/4312* (2013.01); *H04N 21/4394* (2013.01); *H04N 21/4396* (2013.01); *G10L 2015/223* (2013.01); *H04N 21/42206* (2013.01)

(56) References Cited

U.S. PATENT DOCUMENTS

| | | | |
|---|---|---|---|
| 5,832,440 | A | 11/1998 | Woodbridge et al. |
| 5,852,804 | A | 12/1998 | Sako |
| 5,983,186 | A | 11/1999 | Miyazawa et al. |
| 6,629,077 | B1 | 9/2003 | Arling et al. |
| 7,266,498 | B1 | 9/2007 | Connelly |
| 7,292,986 | B1 | 11/2007 | Venolia et al. |
| 8,312,660 | B1 | 11/2012 | Fujisaki |
| 8,498,672 | B1 | 7/2013 | Fujisaki |
| 8,560,324 | B2 | 10/2013 | Shin et al. |
| 8,676,273 | B1 | 3/2014 | Fujisaki |
| 9,154,848 | B2 * | 10/2015 | Ouchi ............ H04N 21/42204 |
| 10,347,246 | B2 | 7/2019 | Lee |
| 2002/0013710 | A1 | 1/2002 | Shimakawa |
| 2002/0077830 | A1 | 6/2002 | Suomela |
| 2003/0028382 | A1 | 2/2003 | Chambers |
| 2003/0138118 | A1 | 7/2003 | Stahl |
| 2005/0015197 | A1 | 1/2005 | Ohtsuji et al. |
| 2006/0019613 | A1 | 1/2006 | Lim |
| 2006/0277050 | A1 | 12/2006 | Kaneko et al. |
| 2008/0089534 | A1 | 4/2008 | Park |
| 2008/0118086 | A1 | 5/2008 | Krig |
| 2008/0282154 | A1 | 11/2008 | Nurmi |
| 2009/0170561 | A1 | 7/2009 | Chou |
| 2009/0253463 | A1 | 10/2009 | Shin |
| 2009/0306980 | A1 | 12/2009 | Shin |
| 2010/0009720 | A1 | 1/2010 | Cha |
| 2010/0104107 | A1 | 4/2010 | Shen |
| 2010/0105364 | A1 | 4/2010 | Yang |
| 2010/0333163 | A1 | 12/2010 | Daly |
| 2011/0173002 | A1 | 7/2011 | Fujii |
| 2011/0313775 | A1 | 12/2011 | Laligand et al. |
| 2012/0226502 | A1 | 9/2012 | Ouchi et al. |
| 2013/0033643 | A1 * | 2/2013 | Kim .................. H04N 21/4223 348/E5.097 |
| 2013/0253933 | A1 * | 9/2013 | Maruta ............... B60R 16/0373 704/246 |
| 2014/0136213 | A1 | 5/2014 | Kim |

FOREIGN PATENT DOCUMENTS

| | | |
|---|---|---|
| CN | 1397063 A | 2/2003 |
| CN | 101163216 A | 4/2008 |
| CN | 101557651 A | 10/2009 |
| CN | 101561965 A | 10/2009 |
| EP | 1 457 969 A1 | 9/2004 |
| EP | 1085500 B1 | 1/2007 |
| JP | 2001-042891 A | 2/2001 |
| JP | 2001100785 A | 4/2001 |
| JP | 2001275176 A | 10/2001 |
| JP | 2001-312297 A | 11/2001 |
| JP | 2002-182691 A | 6/2002 |
| JP | 2003-345390 A | 12/2003 |
| JP | 2004-354682 A | 12/2004 |
| JP | 2006-243730 A | 9/2006 |
| JP | 2006-337513 A | 12/2006 |
| KR | 0122953 Y1 | 5/1994 |
| WO | 02096111 A1 | 11/2002 |

OTHER PUBLICATIONS

Communication dated Jan. 1, 2023 issued by the European Patent Office in counterpart European Patent Application No. 13150618.0.
Communication dated Feb. 14, 2022 issued by the European Intellectual Property Office in counterpart European Application No. 13150618.0.
Communication dated Apr. 29, 2021 issued by the European Intellectual Property Office in counterpart European Application No. 13 150 618.0.
Communication dated Apr. 8, 2020 issued by the European Intellectual Property Office in counterpart European Application No. 13 150 618.0.
Communication dated Jun. 2, 2020 issued by the Brazilian Intellectual Property Office in counterpart Brazilian Application No. BR102013000553-3.
Communication dated Apr. 19, 2019 issued by the State Intellectual Property Office of P.R. China in counterpart Chinese Application No. 201310007787.X.
Communication dated Nov. 1, 2018, from the State Intellectual Property Office of People's Republic of China in counterpart Application No. 201310007787.X.
Communication dated Jul. 27, 2018, issued by the European Patent Office in counterpart European Application No. 13 150 618.0.
Communication dated May 8, 2018, issued by the Japanese Patent Office in counterpart Japanese Patent Application No. 2013-002161.
Communication dated by the State Intellectual Property Office of P.R. China on Jan. 9, 2018 in counterpart Chinese Patent Application No. 201610191047.X.
Communication dated by Intellectual Property India dated Jan. 24, 2018 in counterpart Indian Patent Application No. 63/DEL/2013.
Communication dated Sep. 19, 2017, issued by the State Intellectual Property Office of P.R. China in counterpart Chinese Application No. 201610191047.
Communication on Oct. 17, 2017, issued by the Japanese Patent Office in counterpart Japanese Application No. 2013-002161.
Communication dated Oct. 18, 2017, issued by the State Intellectual Property Office of P.R. China in counterpart Chinese Application No. 201310007787.X.
Communication dated Feb. 28, 2017, issued by the Japanese Patent Office in counterpart Japanese Application No. 2013-002161.
Communication dated Dec. 20, 2016, issued by The State Intellectual Property Office of P.R. China in counterpart Chinese Application No. 201310007787.X.
Communication dated Jan. 5, 2017, issued by The State Intellectual Property Office of P.R. China in counterpart Chinese Application No. 201610191047.X.
Communication dated Sep. 22, 2016, issued by the European Patent Office in counterpart European Patent Application No. 15158073.5.
Communication dated Jul. 10, 2015, issued by the Korean Patent Office in counterpart Korean Patent Application No. 10-2012-0143590.

(56) References Cited

OTHER PUBLICATIONS

Communication dated Jun. 10, 2015, issued by the European Patent Office in counterpart European Patent Application No. 15158073.5.
Communication dated Apr. 25, 2013 issued by the European Patent Office in counterpart European Patent Application No. 13150618.0.
Communication dated Apr. 29, 2013 issued by the International Searching Authority in counterpart International Application No. PCT/KR2013/000173 (PCT/ISa/210).
Communication dated May 30, 2017, issued by the European Patent Office in counterpart European Application No. 15158073.5.
Communication dated Jun. 15, 2017, issued by the State Intellectual Property Office of P.R. China in counterpart Chinese Application No. 201610191047.X.
Communication dated May 27, 2017, issued by the State Intellectual Property Office of P.R. China in counterpart Chinese Application No. 201310007787.X.
Communication dated Jun. 27, 2023 issued from the European Patent Office in EP Patent Application No. 23167814.5.
Communication dated Jun. 23, 2023 issued from the European Patent Office in EP Patent Application No. 13150618.0.
Communication dated May 12, 2023 issued from the Chinese Patent Office in CN Patent Application No. 201910653311.0.
Communication dated Aug. 3, 2023 issued from the European Patent Office in EP Patent Application No. 13150618.0.
Communication dated Oct. 10, 2023 issued from the Chinese Patent Office in CN Patent Application No. 201910653311.0.

* cited by examiner

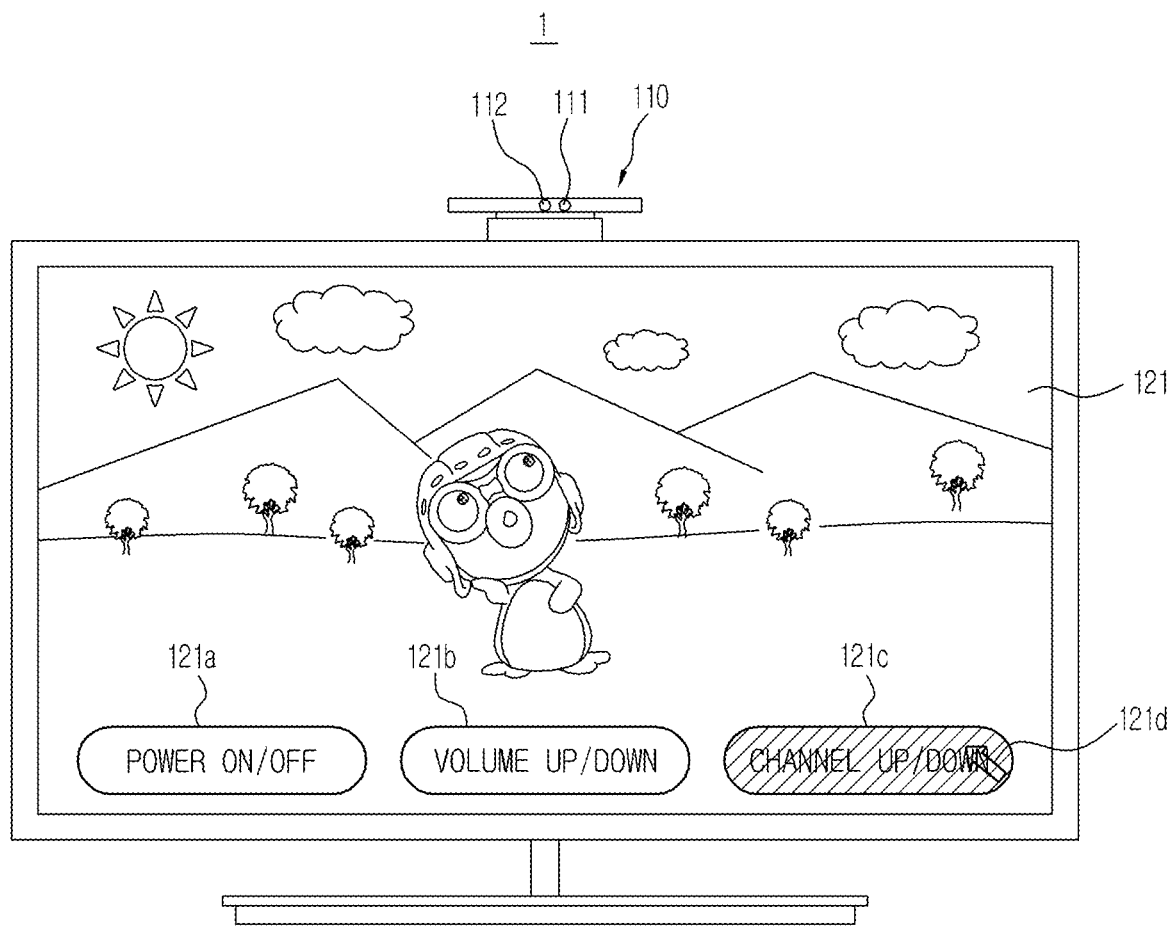

FIG.12C
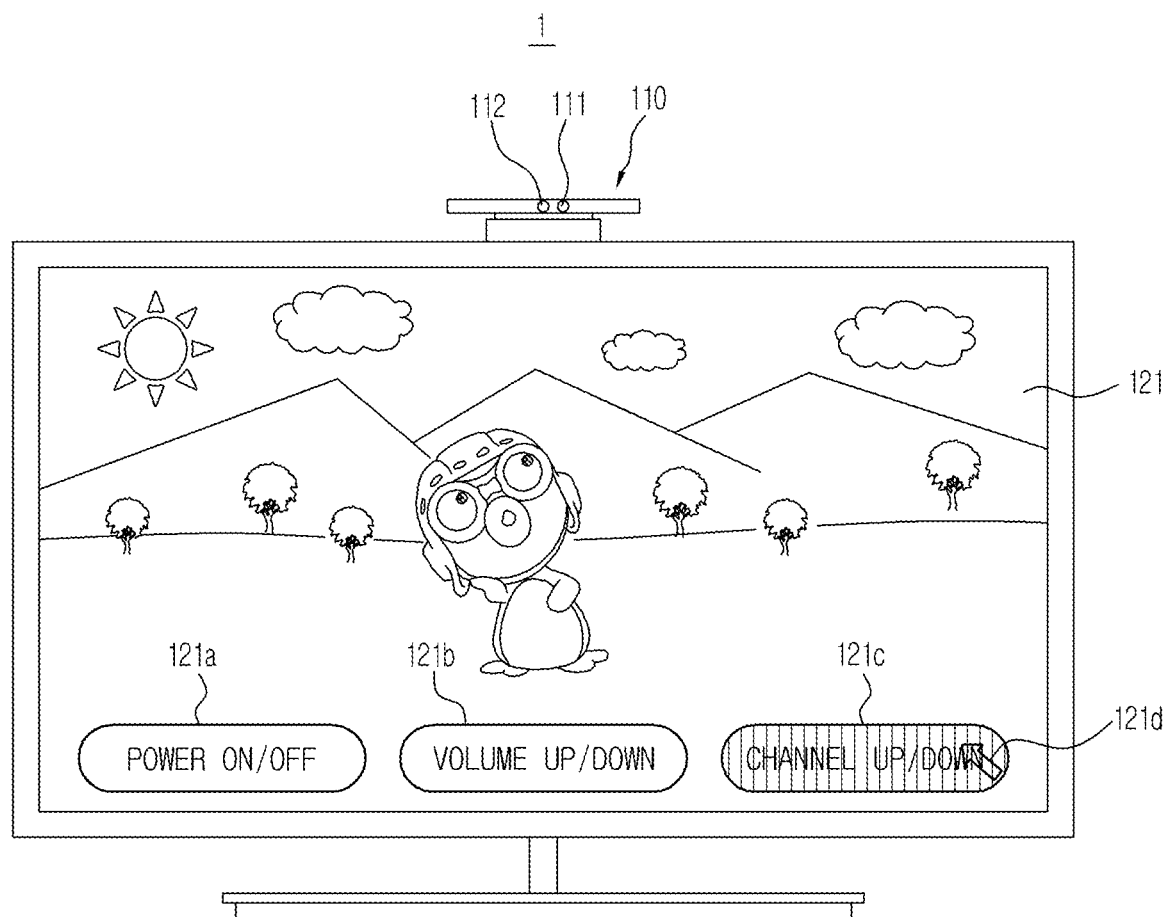
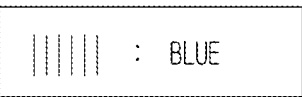

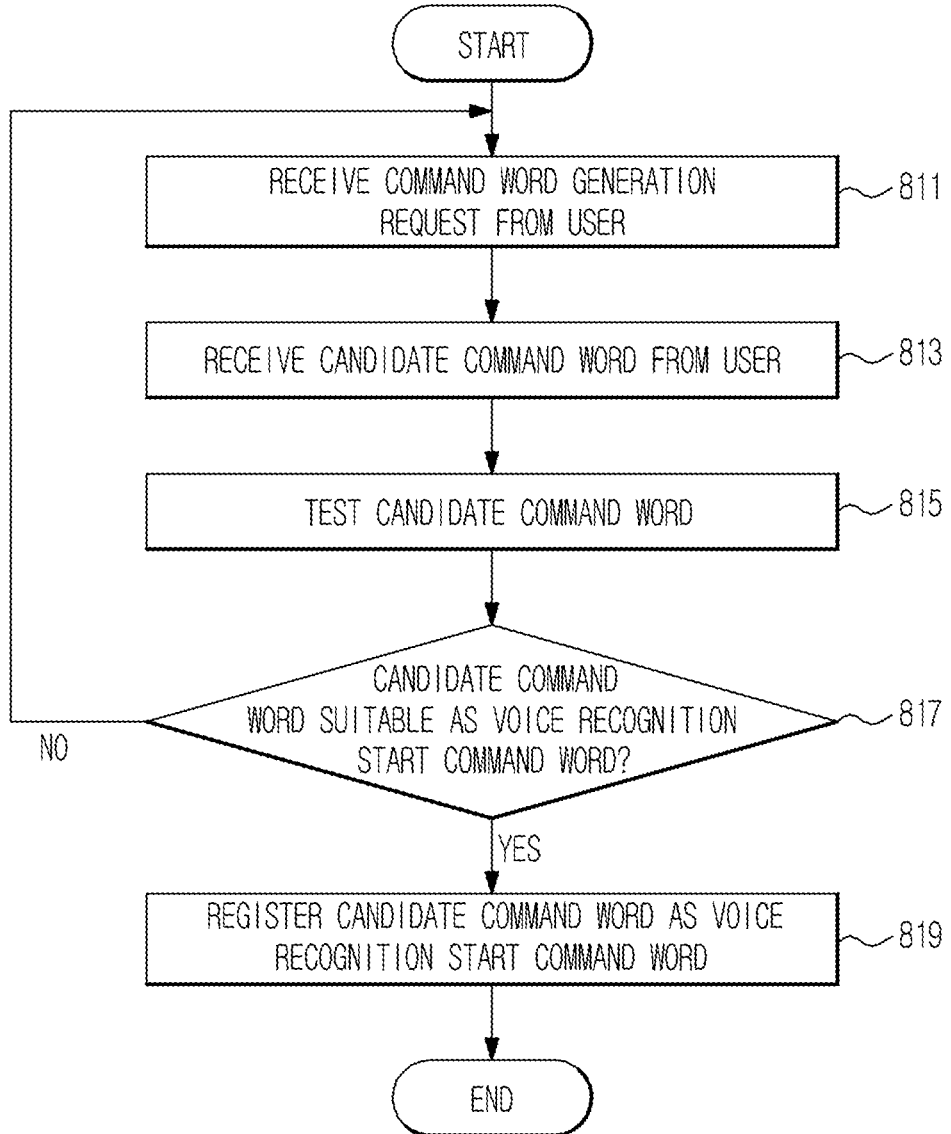

FIG.14B
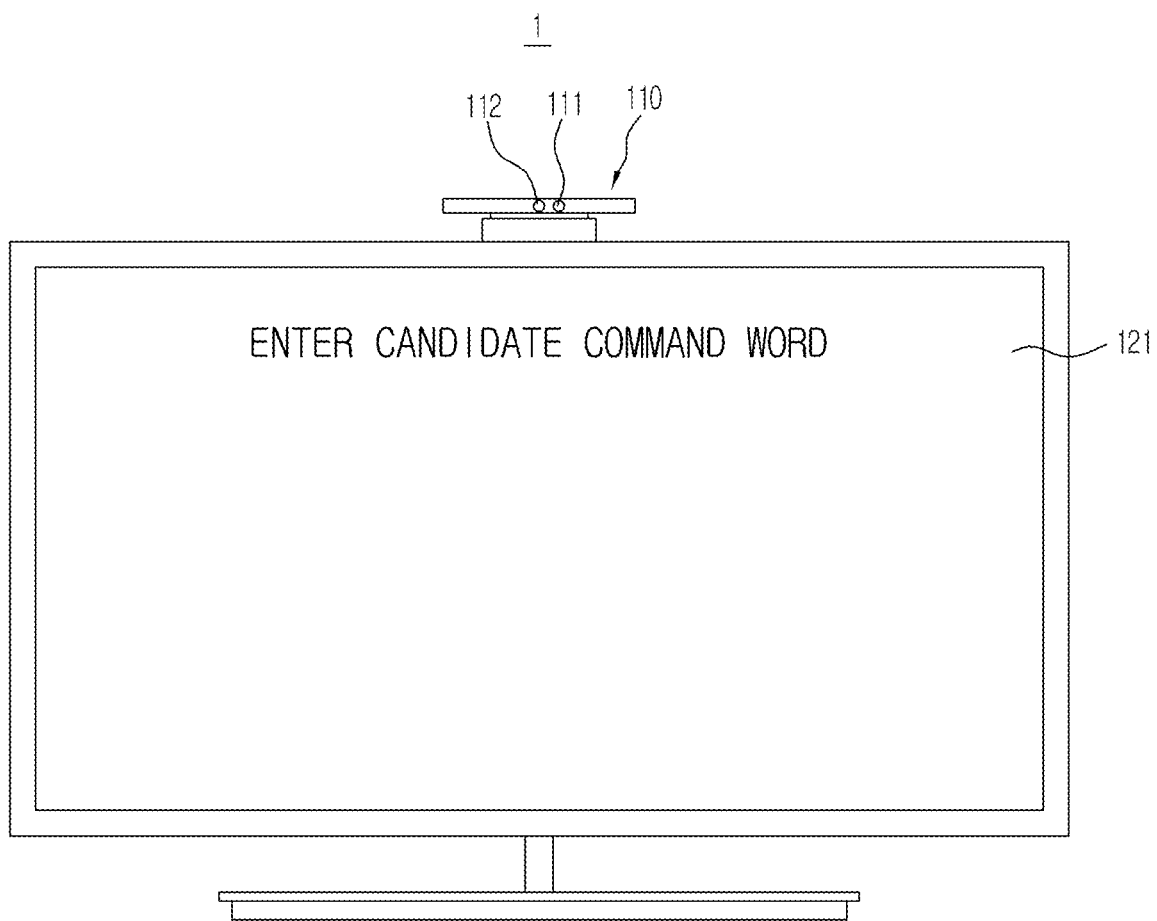
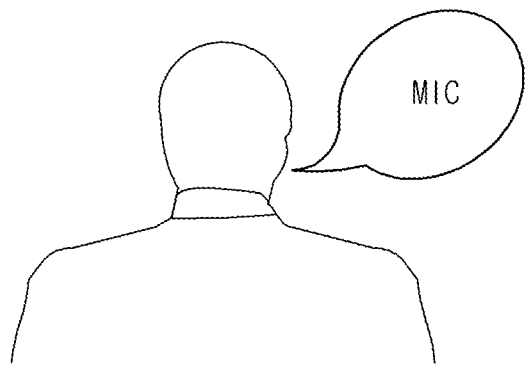

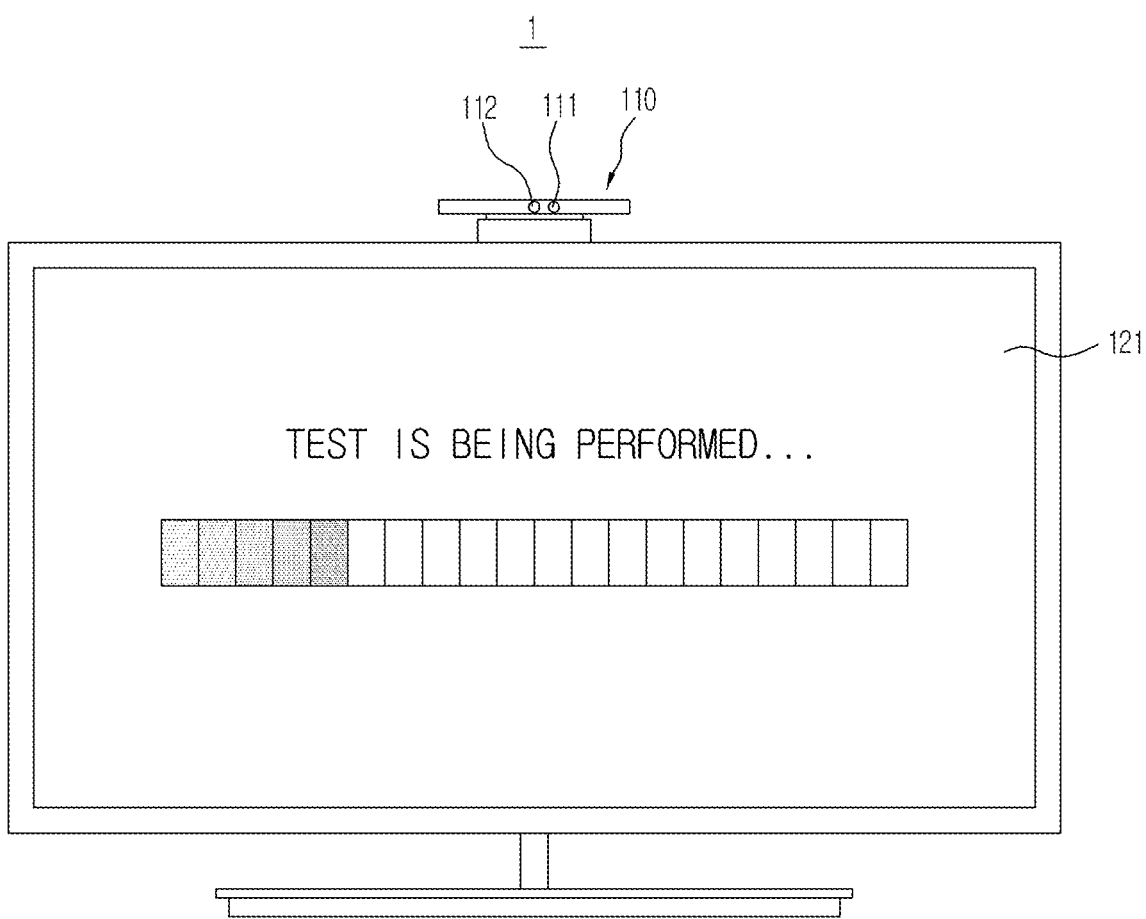

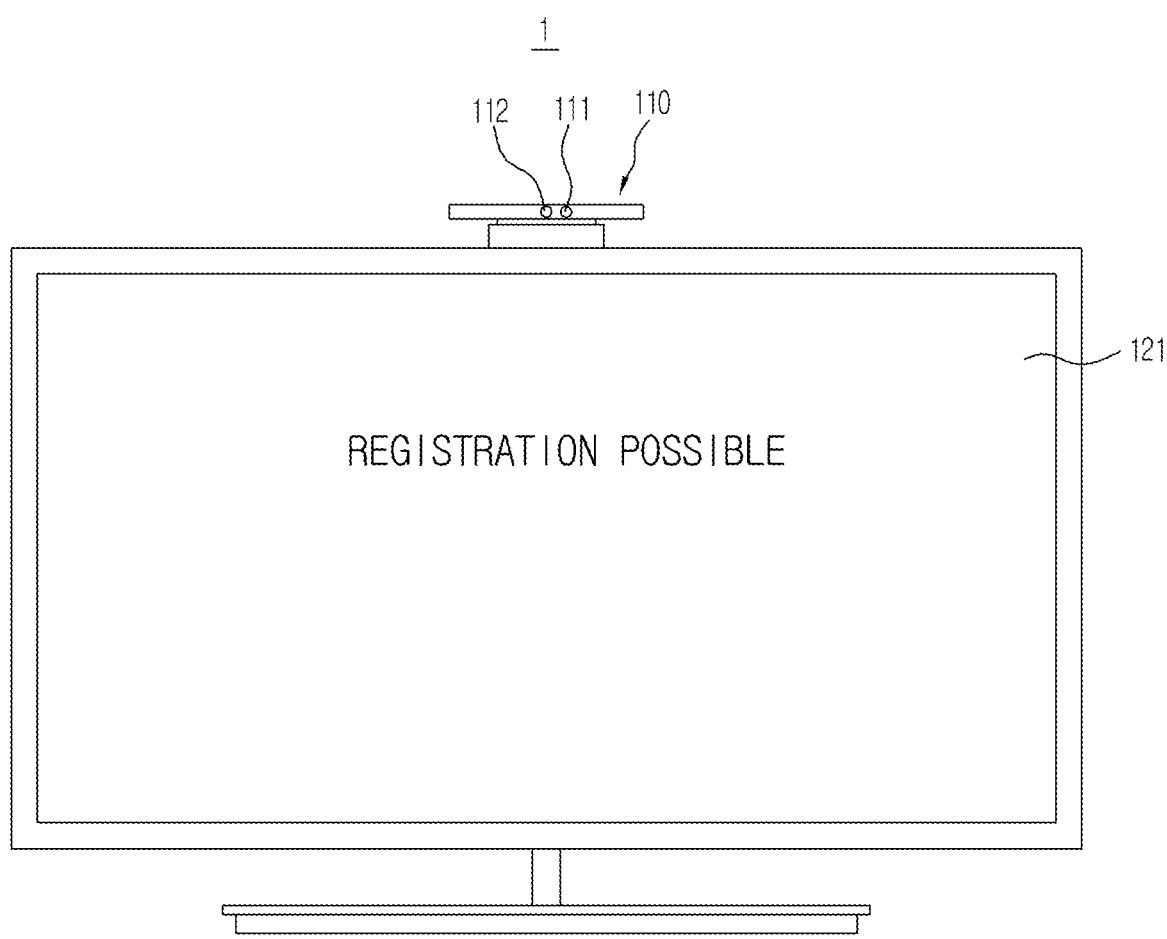

IMAGE DISPLAY APPARATUS AND METHOD OF CONTROLLING THE SAME

CROSS-REFERENCE TO RELATED APPLICATIONS

This is a continuation application of U.S. patent application Ser. No. 17/167,588, filed Feb. 4, 2021, which is a continuation of U.S. patent application Ser. No. 16/569,849, filed Sep. 13, 2019, now U.S. Pat. No. 10,957,323 issued Mar. 23, 2021, which is a continuation application of U.S. patent application Ser. No. 15/722,416, filed Oct. 2, 2017, which is a continuation application of U.S. patent application Ser. No. 15/351,500, filed Nov. 15, 2016, now U.S. Pat. No. 9,786,278 issued Oct. 10, 2017, which is a continuation application of U.S. patent application Ser. No. 14/678,556, filed Apr. 3, 2015, now U.S. Pat. No. 9,530,418 issued Dec. 27, 2016, which is a continuation application of U.S. patent application Ser. No. 13/737,683, filed on Jan. 9, 2013, now U.S. Pat. No. 9,401,149, issued Jul. 26, 2016, which claims priority from Korean Patent Application No. 10-2012-0002659, filed on Jan. 9, 2012 in the Korean Intellectual Property Office, and Korean Patent Application No. 10-2012-0143590, filed on Dec. 11, 2012 in the Korean Intellectual Property Office, the disclosures of which are incorporated herein by reference in their entireties.

BACKGROUND

1. Field

Apparatuses and methods consistent with exemplary embodiments relate to an image display apparatus that executes a command through voice recognition and a method of controlling the same.

2. Description of the Related Art

In general, an image display apparatus, e.g., a television (TV), processes and outputs a video signal in various formats. Recently, as a digital TV having a signal processing and a storage capacity superior to existing analog TVs has been developed and commercially used, various kinds of content services, such as real-time broadcast, content on demand (COD), games and video communication, may be provided to users using an Internet network installed in each home.

In addition, when an image display apparatus receives a command from a user in order to perform various functions including various kinds of services, a voice recognition method of receiving a user voice through a microphone, recognizing the received user voice, and executing a command corresponding to the received user voice has been applied.

However, when the user voice is received through the microphone, background sound is also received and, more particular, an audio signal output from the image display apparatus may be received. If the volume of the background sound or the audio signal output of the image display apparatus exceeds a predetermined level, a user voice recognition rate of the image display apparatus may be decreased.

SUMMARY

Therefore, aspects of one or more exemplary embodiments provide an image display apparatus able to improve voice recognition performance by decreasing the volume of an audio signal output from the image display apparatus to a predetermined level or less when the image display apparatus recognizes a user voice, and a method of controlling the same.

Additional aspects will be set forth in part in the description which follows and, in part, will be obvious from the description, or may be learned by practice of exemplary embodiments.

According to an aspect of an exemplary embodiment, there is provided an image display apparatus enabling voice recognition, the image display apparatus including: a first voice inputter which receives a user-side audio signal; an audio outputter which outputs an audio signal processed by the image display apparatus; a first voice recognizer which analyzes the user-side audio signal received through the first voice inputter; and a controller which decreases a volume of the output audio signal to a predetermined level if a voice recognition start command is received, the voice recognition start command indicating a start of a voice recognition in the analyzed user-side audio signal.

The voice recognition start command may be received as a voice signal of a user through the first voice inputter.

The controller may determine that the voice recognition start command is received if a voice recognition start command word is received through the first voice inputter.

The controller may determine that the voice recognition start command is received if voice having a predetermined volume or more is received through the first voice inputter.

The image display apparatus may further include a background sound canceller to reduce background sound other than the voice signal of the user from the user-side audio signal.

The background sound canceller may reduce audio output through the audio outputter from the user-side audio signal received through the first voice inputter.

The controller may return the volume of the output audio signal to a volume of the audio signal when the voice recognition begins.

The controller may determine that the voice recognition ends if a control command of the user is not received through the first voice inputter for a predetermined voice recognition end time or more.

The controller may request the user to input a control command if the control command of the user is not received through the first voice inputter for a predetermined command request time or more.

The controller may determine that voice recognition ends if a voice recognition end command word is received through the first voice inputter.

The image display apparatus may further include a command word generator to generate a voice recognition start command word corresponding to the voice recognition start command.

The command word generator may receive a candidate command word through the first voice inputter, test whether the candidate command word is suitable as the voice recognition start command word, and register the candidate command word as the voice recognition start command if the candidate command word is suitable as the voice recognition start command word.

The command word generator may receive a selection command from the user and select and set the voice recognition start command word according to the received selection command if the number of registered voice recognition command words is two or more.

The image display apparatus may further include a remote controller which remotely controls the image display apparatus, and the remote controller may include an input button which receives a control command of a user, a second voice inputter which receives a user-side audio signal, and a second voice recognizer which analyzes the user-side audio signal received through the second voice inputter.

The controller may determine that the voice recognition start command is received if voice having a predetermined volume or more is received through the second voice inputter.

The controller may return the volume of the audio signal output through the audio output unit to the volume of the audio signal when the voice recognition begins, if the voice recognition ends.

The controller may determine that the voice recognition ends if the control command of the user is not received through the second voice inputter for a predetermined voice recognition end time or more.

The controller may request the user to input a control command if the control command of the user is not received through the second audio inputter for a predetermined command request time or more.

The controller may determine that voice recognition ends if a voice recognition end command is received through the input button or the second voice inputter.

According to an aspect of another exemplary embodiment, there is provided an image display apparatus enabling voice recognition, the image display apparatus including: a voice inputter which receives a control command word from a user; and a display which displays at least one icon corresponding to a plurality of control command words and which changes an icon, among the at least one icon, corresponding to the received control command word if the control command word is received from the user through the voice inputter.

According to an aspect of another exemplary embodiment, there is provided a method of controlling an audio outputting apparatus including an audio outputter, the method including: receiving a user-side audio signal from a user; determining whether the received user-side audio signal corresponds to a voice recognition start command word; and decreasing a volume of an audio signal output through the audio outputter to a predetermined level if the received user-side audio signal corresponds to the voice recognition start command word.

The method may further include reducing a background sound signal other than a voice signal of the user from the user-side audio signal if the user-side audio signal is received through the voice inputter.

The background sound signal may be an audio signal output through the audio outputter.

The method may further include returning the volume of the output audio signal to a volume of the audio signal when voice recognition begins, if the voice recognition ends.

Ending of the voice recognition may include determining that the voice recognition ends if a control command of the user is not received through the voice inputter for a predetermined voice recognition end time or more.

Ending of voice recognition may include determining that the voice recognition ends if a voice recognition end command word is received through the voice inputter.

According to an aspect of another exemplary embodiment, there is provided a method of controlling a processing apparatus enabling voice recognition, the method including: receiving a candidate command word from a user through a voice inputter; testing whether the received candidate command word is suitable as a control command word to be subjected to the voice recognition; and registering the candidate command word as the control command if the candidate command word is suitable as the control command word according to the testing.

According to an aspect of another exemplary embodiment, there is provided a method of controlling a processing apparatus, the method including: decreasing a volume of an audio signal output from the processing apparatus to a predetermined volume if a voice recognition start command is received from the user through a voice inputter of the processing apparatus or a remote controller; and returning the volume of the output audio signal to an original level if a voice recognition end command is received from the user.

The receiving the voice recognition start command may include receiving the voice recognition start command of the user through the voice inputter.

The receiving the voice recognition start command may include receiving voice having a predetermined volume or more through the voice inputter.

The receiving the voice recognition end command may include receiving a voice recognition end command word of the user through the voice inputter.

The voice recognition end command may be received when the control command is not received through the voice inputter for a predetermined voice recognition end time or more.

According to an aspect of another exemplary embodiment, there is provided a processing apparatus, including: an audio output controller which controls an output of an audio signal; and a controller which, in response to determining that a voice recognition starts, performs at least one of decreasing a volume of the output audio signal to a predetermined level and reducing a background sound other than a voice signal of a user from a user-side audio signal received from the user.

According to aspects of one or more exemplary embodiments, it is possible to improve user voice recognition performance of an image display apparatus and prevent malfunction of the image display apparatus due to voice recognition errors.

BRIEF DESCRIPTION OF THE DRAWINGS

These and/or other aspects will become apparent and more readily appreciated from the following description of exemplary embodiments, taken in conjunction with the accompanying drawings of which:

FIGS. 12A-12C are diagrams showing a screen displayed on a video output unit if an image display apparatus according to an exemplary embodiment is in a voice recognition mode;

FIG. 13 is a flowchart illustrating a method of generating a command word by a user in an image display apparatus according to an exemplary embodiment; and FIGS. 14A-14D are diagrams showing a screen displayed on a video output unit if an image display apparatus according to an exemplary embodiment generates a command word by a user.

DETAILED DESCRIPTION OF EXEMPLARY EMBODIMENTS

Figure 1:
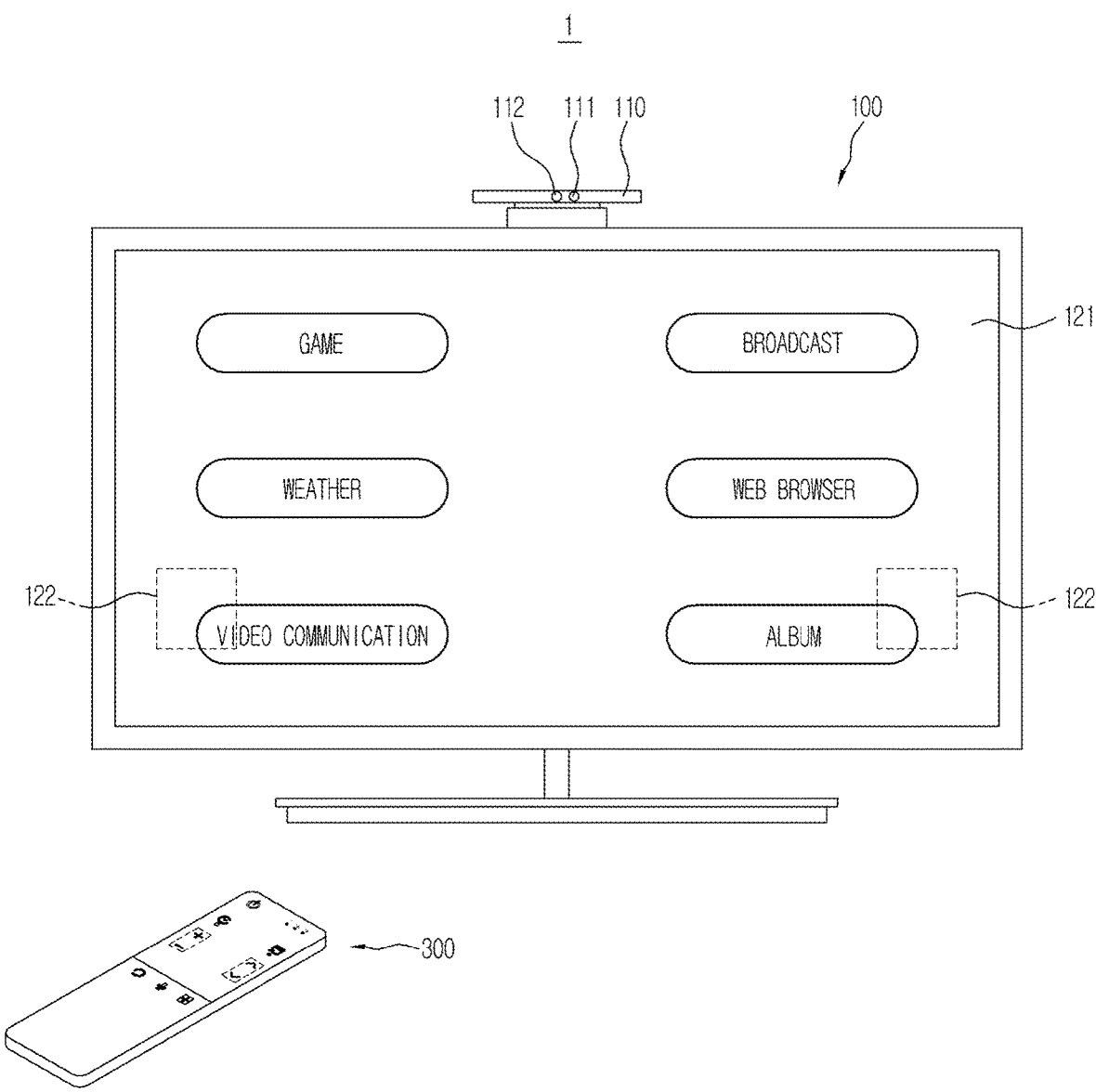
FIG. 1 is a diagram showing the appearance of an image display apparatus according to an exemplary embodiment.

Exemplary embodiment described in the present specification and the configurations shown in the drawings are merely exemplary and various modifications may be made thereto.

Reference will now be made in detail to exemplary embodiments, examples of which are illustrated in the accompanying drawings.

FIG. 1 is a diagram showing the appearance of an image display apparatus 1 according to an exemplary embodiment.

Referring to FIG. 1, the image display apparatus 1 includes an image display apparatus main body 100 to output at least one of video and audio according to a control command of a user, and a remote controller 300 to remotely control the image display apparatus main body 100.

The image display apparatus main body 100 may be implemented by a digital TV and includes a video output unit 121 (e.g., video outputter) to output a video signal of a broadcast program and a video signal of a variety of content, an audio output unit 122 (e.g., audio outputter) to output an audio signal of a broadcast program and an audio signal of a variety of content, and a user input unit 110 (e.g., user inputter) to acquire a control command through user voice or operation.

The image display apparatus 1 according to the present exemplary embodiment enables video communication through a wired and/or wireless network. If the image display apparatus 1 provides a video communication service, it is possible to output a video signal of the other party of the video communication service through the video output unit 121 and to output an audio signal of the other party through the audio output unit 122. In this case, the video signal and the audio signal of the user may be acquired through the user input unit 110 and transmitted to the other party.

The audio output unit 122 may be implemented by a speaker, etc., and output an audio signal processed by the image display apparatus 1. More specifically, the audio output unit 122 outputs an audio signal included in a broadcast program signal or an audio signal included in content executed by the image display apparatus 1. In addition, as described above, if the image display apparatus 1 performs a video communication operation, an audio signal of the other party may be output. Although the image display apparatus 1 of the present exemplary embodiment includes the audio output unit 122 at the rear side thereof, it is understood that one or more other exemplary embodiments are not limited thereto and the audio output unit 122 may be mounted at any place where audio is provided to a user.

The video output unit 121 outputs a video signal processed in the image display apparatus 1. More specifically, the video output unit 121 outputs a video signal included in a broadcast program signal or a video signal included in content in the image display apparatus 1. In addition, if the image display apparatus 1 performs a video communication operation, a video signal of the other party of the video communication may be output.

The user input unit 110 includes an image input unit 111 (e.g., image inputter) to receive an image of a user and a first voice input unit 112 (e.g., first voice inputter) to receive user voice.

The image input unit 111 includes a lens to receive an image of a user, an imaging device to capture the image of the user through the lens, such as a charge coupled device (CCD) sensor or a complementary metal-oxide semiconductor (CMOS) sensor, and an image signal processor (ISP) to process the image captured by the imaging device.

The first voice input unit 112 may be implemented by a microphone, etc., and receives a user voice. However, the first voice input unit 112 may receive background sound and, more particularly, an audio signal output from the audio output unit 122 of the image display apparatus 1, in addition to the user voice. Accordingly, in the following disclosure, a signal received through the first voice input unit 112, i.e., an audio of a surrounding environment surrounding the image display apparatus 1 or another device which captures the signal (e.g., a remote controller), is referred to as a "user-side audio signal." The user-side audio signal may include not only a user voice signal, but also a background sound signal.

As shown in FIG. 1, although the image display apparatus 1 includes a Multimedia over Internet Protocol (MoIP) device in which a video input unit 111 and a voice input unit 112 are integrally included, it is understood that one or more other exemplary embodiments are not limited thereto and the image display apparatus 1 may include the first voice input unit 112 and not the image input unit 111.

Instead of pressing an input button included in the remote controller 300 or the image display apparatus main body 100, a user may input a control command as a voice signal to the image display apparatus 1 according to an exemplary embodiment through the first voice input unit 112, thereby controlling an operation of the image display apparatus 1. For example, as shown in FIG. 1, if various content menus are displayed on the video output unit 121, the user may select a menu by inputting a command word corresponding to a desired menu to the first voice input unit 112 as a voice signal.

The user input unit 110 may be implemented separately from the image display apparatus main body 100 as shown in FIG. 1 or integrally with the image display apparatus main body 100.

Figure 2:
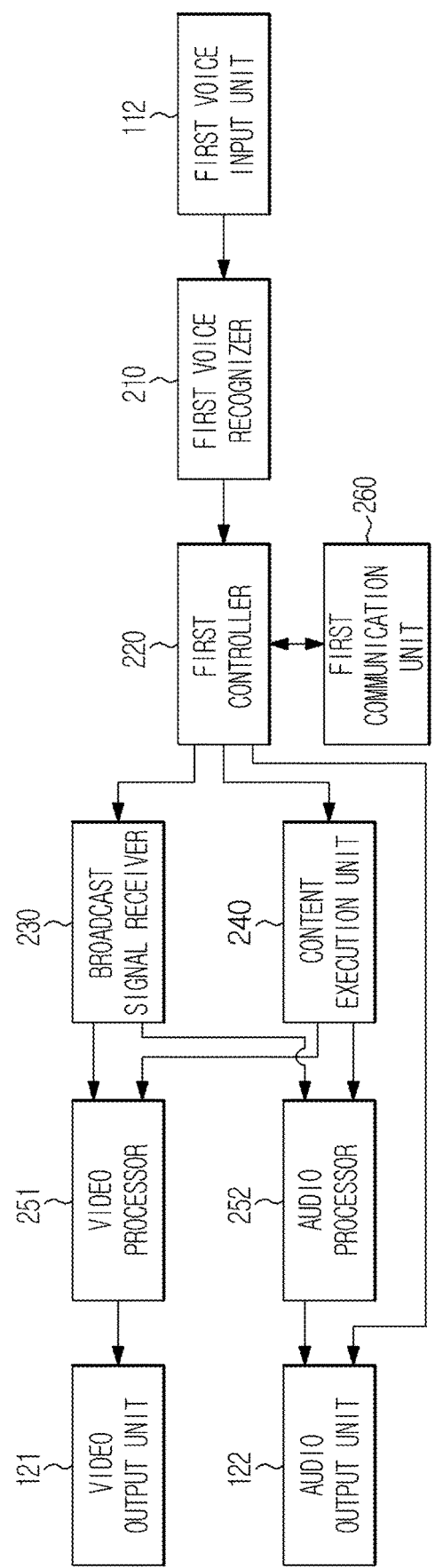
FIG. 2 is a block diagram showing a control flow of an image display apparatus main body according to an exemplary embodiment.

FIG. 2 is a block diagram showing a control flow of an image display apparatus main body 100 according to an exemplary embodiment.

Referring to FIG. 2, the image display apparatus main body 100 according to the present exemplary embodiment includes a broadcast signal receiver 230 to receive a broadcast signal, a content execution unit 240 (e.g., content executor) to execute content, a video processor 251 to process a video signal in the received broadcast signal or a video signal included in the content, an audio processor 252 to process an audio signal included in the received broadcast signal or an audio signal included in the content, a video output unit 121 (e.g., video outputter) to output the video signal processed by the video processor 251, an audio output unit 122 (e.g., audio outputter) to output the audio signal processed by the audio processor 252, a first voice input unit 112 to receive a voice signal from a user, a first voice recognizer 210 to recognize a control command based on the voice signal received from the user, a first communication unit 260 (e.g., first communicator) to receive a control signal from the remote controller 300, and a first controller 220 to control an overall operation of the image display apparatus main body 100.

The broadcast signal receiver 230 receives a broadcast signal including a video signal and an audio signal. The broadcast signal receiver 230 includes an antenna and a tuner, outputs the video signal through the video output unit 121, and outputs the audio signal through the audio output unit 122.

The content execution unit 240 executes multimedia content. The multimedia content executed by the content execution unit 240 may be a game, a moving image file, a music file, etc., stored in the image display apparatus 1 or a variety of multimedia content provided over the Internet if the image display apparatus 1 is connected to the Internet by wire or wirelessly. In addition, if the image display apparatus is connected to another external device such as a mobile communication apparatus or a computer, the multimedia content may be provided by the connected external apparatus and the kind of the multimedia content executed by the content execution unit 240 is not limited.

The audio processor 252 processes the audio signal received from the broadcast signal receiver 230 and the content execution unit 240 and outputs the processed audio signal through the audio output unit 122. The audio processor 252 may include a decoder to decode a signal compressed in a predetermined format, such as a broadcast audio signal, and a digital/analog converter to convert the digital signal into an analog signal, and transmits the analog signal to the audio output unit 122.

The video processor 251 processes the video signal received from the broadcast signal receiver 230 and the content execution unit 240 and outputs the processed video signal through the video output unit 121. The video processor 251 may include a decoder to decode a signal compressed in a predetermined format, such as a broadcast video signal, and a digital/analog converter to convert the digital signal into an analog signal, and transmits the analog signal to the video output unit 121.

The first voice input unit 112 receives a voice signal related to a control command from the user. The first voice input unit 112 may be implemented by a microphone or may be implemented by an MoIP device in which a microphone and a camera are integrally included, e.g., as shown in FIG. 1. In addition, the first voice input unit 112 may amplify the received user-side audio signal, convert the amplified user-side audio signal from an analog signal into the digital signal, and transmit the digital signal to the first voice recognizer 210.

The first voice input unit 112 may include a voice encoder. If the first voice input unit 112 is connected to the image display apparatus main body 100 through a data interface, the voice encoder may compress the user-side audio signal into a format suitable for a bandwidth of the data interface or compress the user-side audio signal into a format capable of being transmitted to the other party of a video communication if the video communication is performed. In this case, the image display apparatus main body 100 may include a voice decoder to decode the compressed user-side audio signal before voice recognition.

As described above, when the first voice input unit 112 receives user voice, background sound may also be received. Thus, the first voice input unit 112 receives the user-side audio signal including a user voice signal. When the user inputs a control command through the first audio input unit 112, since the image display apparatus 1 is operating, the user-side audio signal may include the user voice signal and the audio signal output through the audio output unit 122.

The first voice recognizer 210 analyzes the user voice signal received through the first voice input unit 112 and recognizes the control command input by the user. The voice recognition method may include at least one of a pattern matching method of comparing a received voice signal with a previously stored standard pattern and detecting a voice pattern most similar to the received voice signal, an identification function method of setting a function for distinguishing between one word and another word in advance, applying the set function to a user voice signal, and determining the user voice signal, etc. In addition, voice recognition may be performed in word units or phoneme units. As the voice recognition method of the voice recognizer 210, any related art method may be employed and exemplary embodiments are not limited to the above-described methods.

The first communication unit 260 receives a control signal from the remote controller 300 and provides the control signal to the first controller 220. The first communication unit 260 may employ not only a wireless communication scheme such as a Wi-Fi communication scheme, a Bluetooth communication scheme, a ZigBee communication scheme, etc., but also an infrared communication scheme having a relatively simple configuration.

The first controller 220 receives the recognition result from the first voice recognizer 210 and performs a control according to the recognition result. For example, if the control command according to the recognition result is broadcast channel change, a control signal is sent to the broadcast signal receiver 230 to change the channel according to the control command and, if the control command according to the recognition result is content selection, a control signal is sent to the content execution unit 240 to execute the content according to the control command.

The first controller 220 decreases the volume of the audio signal output from the audio output unit 122 to a predetermined level if the control command transmitted by the first voice recognizer 210 is a voice recognition start command. If a predetermined voice recognition start command word is received through the first voice input unit 112 or if voice having a predetermined reference volume or more is received, the first voice recognizer 210 recognizes the received command or voice as the voice recognition start command and transmits the voice recognition start command to the first controller 220. The first controller 220 may receive the voice recognition start command, switch the image display apparatus 1 to a voice recognition mode, and decrease the volume of the audio output unit 122 to a predetermined level.

In reception of the voice recognition start command through the voice recognition start command word, the voice recognition start command word may be set to a simple word capable of easily being recognized such as "Hi TV," "TV," etc. As described above, the user may input a voice recognition start command through an input button included in the remote controller 300 or the image display apparatus main body 100.

As described above, the user-side audio signal may include a user voice signal and an audio signal output through the audio output unit 122. If the user-side audio signal includes such background sound, the voice recognition rate of the first voice recognizer 210 may be deteriorated. If the first controller 220 decreases the volume of the audio signal output through the audio output signal 122 to a predetermined level while voice recognition is performed, only the user voice signal is extracted even when the user-side audio signal includes background sound, thereby easily recognizing the control command.

The predetermined volume level may indicate a volume level capable of ensuring a predetermined voice recognition rate or more even when background sound is included. For example, if a volume capable of ensuring a voice recognition rate of 80% or more is 5, the volume of the audio signal output through the audio output unit 122 may be set to be decreased to 5 when the voice recognition start command is received. The predetermined volume may be previously set in a manufacturing process through experimentation or statistical analysis or may be previously set by a user.

The predetermined volume level may not be 0. For example, a user may input a control command to select content through voice recognition in order to view an album stored in the image display apparatus 1 while listening to music through the image display apparatus 1. At this time, if the volume of the audio signal output from the audio output unit 122 is set to 0 to perform a mute function, operation continuity is not achieved and user intention to simultaneously perform several operations is not achieved. Accordingly, the predetermined volume may be appropriately selected in consideration of operation continuity and voice recognition rate.

In addition, the first controller 220 may maintain the current volume level if the current volume level is determined to be equal to or less than the predetermined volume level.

If voice recognition ends, the first controller 220 returns the volume level of the audio signal output from the audio output unit 122 to the original level. If a voice recognition end command is received through the first voice input unit 112, if a control command to be subjected to voice recognition is not received for a predetermined reference time, or if a voice recognition end command is received through an input button included in the remote controller 300 or the image display apparatus main body 100, it may be determined that voice recognition ends.

Figure 3:
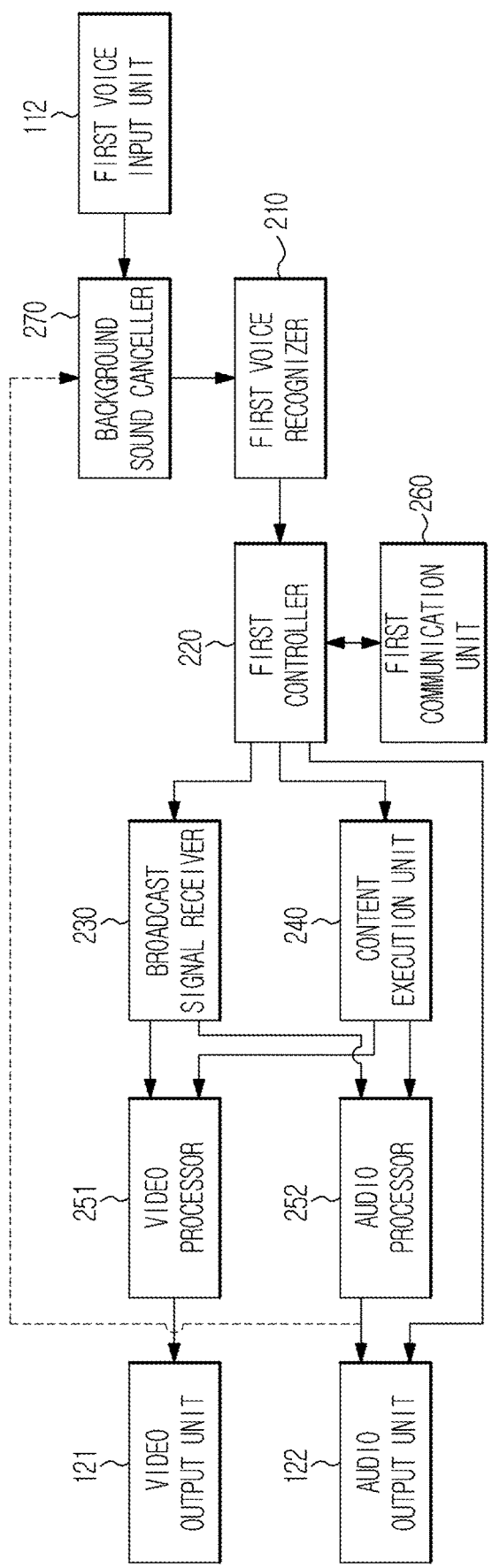
FIG. 3 is a block diagram showing a control flow of an image display apparatus according to an exemplary embodiment, which further includes a background sound canceller.

FIG. 3 is a block diagram showing a control flow of an image display apparatus 1 according to an exemplary embodiment, which further includes a background sound canceller 270.

In the exemplary embodiment of FIG. 3, descriptions of the same portions as FIG. 2 will be omitted and the background sound canceller 270 will be focused upon for convenience of description.

As described above, if the user-side audio signal includes background sound, the voice recognition rate of the first voice recognizer 210 is deteriorated and a voice signal having good quality may not be transmitted to the other party if video communication is performed. Accordingly, the image display apparatus 1 according to the present exemplary embodiment may further include the background sound canceller 270 to cancel or reduce background sound from the user-side audio signal.

The background sound canceller 270 may be implemented by an acoustic echo canceller. The acoustic echo canceller receives a reference signal and a user-side audio signal including a user voice signal and background sound and cancels the background sound from the received user-side audio signal based on the reference signal. In the image display apparatus 1 according to the present exemplary embodiment, the audio signal output through the audio output unit 122 is set to the reference signal and the audio signal output through the audio output unit 122 is cancelled from the user-side audio signal input to the background sound canceller 270. In addition, if the user views a broadcast program, the audio signal received by the broadcast signal receiver 230 may be set as a reference signal and, if content is executed, the audio signal generated by the content execution unit 240 may be set as a reference signal.

The user-side audio signal, from which background sound is cancelled by the background sound canceller 270, is transmitted to the first audio recognizer 210. If the user inputs a voice recognition start command as a voice signal, the user-side audio signal is transmitted to the first audio recognizer 210 in a state in which the volume level of the audio output unit 122 is not decreased. Accordingly, if the background sound canceller cancels background sound, the voice recognizer may easily recognize the voice recognition start command.

However, even when the background sound canceller 270 cancels background sound, if the volume of the audio signal output through the audio output unit 122 is equal to or greater than a predetermined level, it is difficult to divide the user voice signal and the background sound signal and cancel only the background sound signal. Even when the background sound canceller 270 cancels the background sound signal to some extent, residual sound of background sound may be present and thus the voice recognition rate of the first voice recognizer 210 may be decreased.

In addition, voice recognition errors may be reduced using only the background sound canceller 270 by setting the voice recognition start command word to a simple word capable of being easily subjected to voice recognition. However, since other control command words are longer and more complicated than the voice recognition start command word, it may be difficult to obtain a desired voice recognition rate only by cancelling background sound. Accordingly, in an exemplary embodiment, after it is determined that the voice recognition start command is received in the first voice recognizer 210, the first controller 220 may decrease the volume of the audio output unit 122 to a predetermined level, thereby further improving voice recognition performance.

Figure 4:
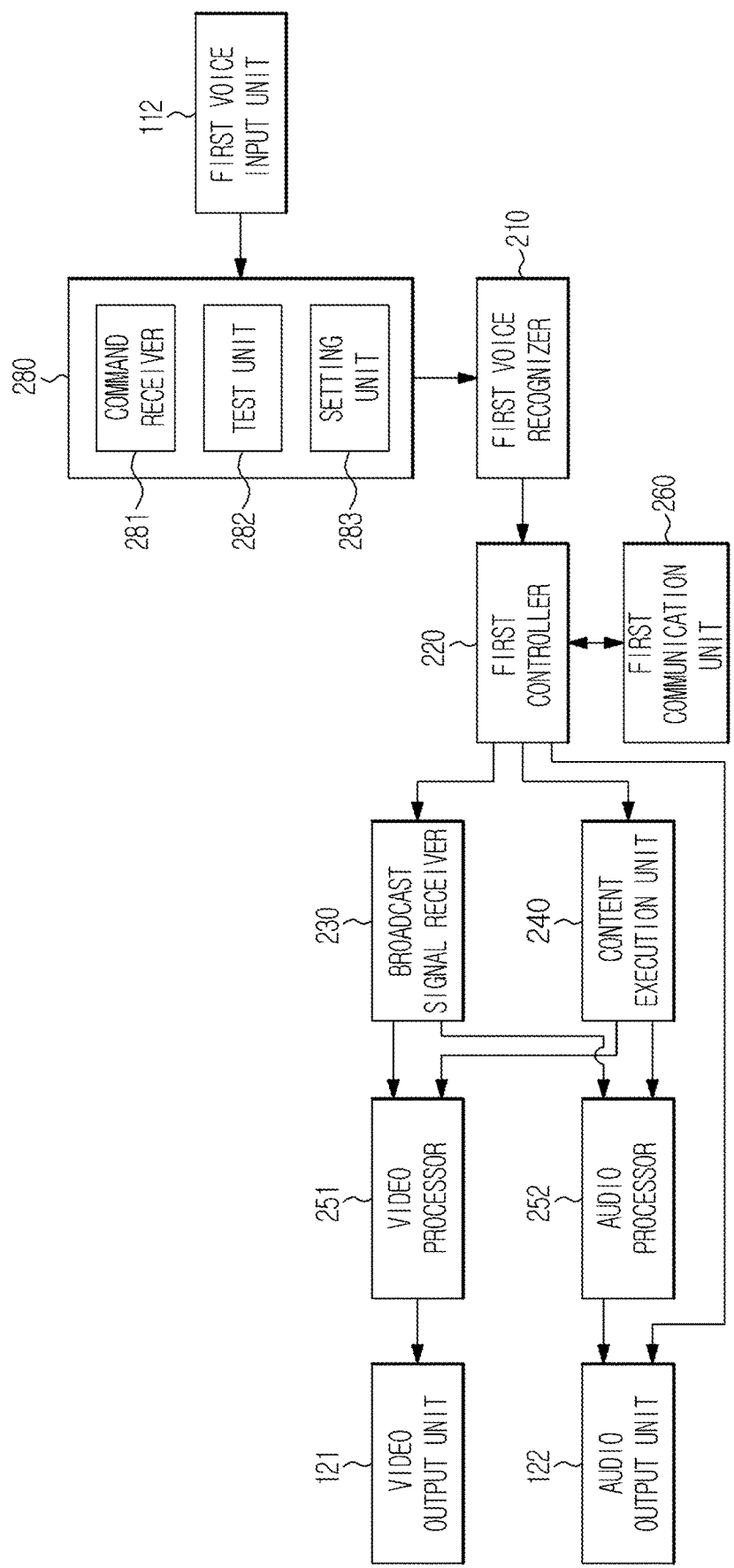
FIG. 4 is a block diagram showing a control flow of an image display apparatus according to an exemplary embodiment, which further includes a command word generator.

FIG. 4 is a block diagram showing a control flow of an image display apparatus 1 according to an exemplary embodiment, which further includes a command word generator 280.

As shown in FIG. 4, the image display apparatus 1 may further include the command word generator 280 to allow a user to generate a command word.

The command word generator 280 includes a command word receiver 281 to receive a candidate command word from a user, a test unit 282 (e.g., tester) to test whether the received candidate command word is suitable as a control command word and a setting unit 283 (e.g., setter) to determine whether the candidate command word is registered according to the test result of the test unit 282.

The command word generator 280 may generate all command words to be recognized by the image display apparatus 1 and is particularly used to generate a voice recognition start command word.

As described above, if a user-side audio signal includes background sound, voice recognition performance is deteriorated. In particular, if the volume level of background sound is significantly high, even when the background sound canceller 270 cancels the background sound, voice recognition errors may occur. If it is determined that the voice recognition start command is received in the first voice recognizer 210, the volume of the audio output unit 122 is decreased to a predetermined level. However, since the voice recognition start command is received in a state in which the volume of the audio output unit 122 is not controlled, the voice recognition start command word may be set to a word capable of being easily recognized by the voice recognizer even when the volume of background sound is high.

More specifically, the user may register and use a new command word in addition to a command word which is previously set in the image display apparatus. If the user inputs a new command word through the first voice input unit 112 as a candidate command word, the command word receiver 281 receives a voice signal related to the candidate command word.

The test unit 282 tests whether the candidate command word received by the command word receiver 281 is suitably used as the voice recognition start command. In other words, the test unit 282 determines whether the candidate command word may be easily recognized by the voice recognizer or whether a predetermined voice recognition rate is maintained even when the candidate command word and background sound are simultaneously received.

The setting unit 283 determines whether the candidate command word is registered according to the test result of the test unit 282. For example, if the voice recognition rate of the candidate command word is 80% or more as the test result of the test unit 282, the candidate command word is registered as the voice recognition start command word and is transmitted to the first voice recognizer 210. Thereafter, if the registered command word is received through the first voice input unit 112, the first voice recognizer 210 recognizes the received command word as the voice recognition start command word and sends a signal to the first controller 220.

If the user inputs and registers a plurality of candidate command words, a command related to command word selection may be received from the user and the command word according to the selection command of the user may be set as the voice recognition start command word. If the plurality of command words is registered as the voice recognition start command word, the first voice recognizer 210 determines that the voice recognition start command is received if any one of the plurality of command words is received through the first voice input unit 112.

Figure 5:
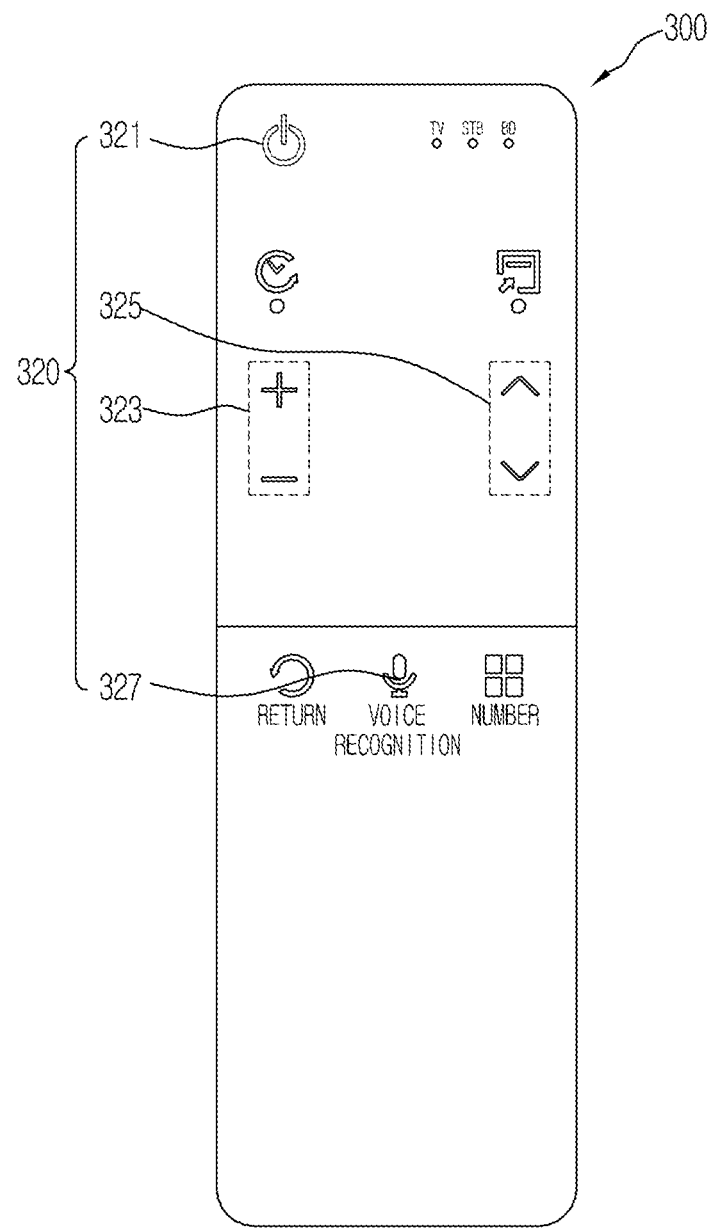
FIG. 5 is a diagram showing the appearance of a remote controller included in an image display apparatus according to an exemplary embodiment.

FIG. 5 is a diagram showing the appearance of a remote controller 300 included in an image display apparatus 1 according to an exemplary embodiment.

Referring to FIG. 5, the remote controller 300 includes input buttons 320 to receive a control command of a user through touch or button manipulation, and a second voice input unit 312 (e.g., second voice inputter) (see FIG. 6) to receive a control command of a user through voice.

The input button 320 includes a power button 321 to power the image display apparatus 1 on or off, a volume control button 323 to control the volume of the audio signal output from the image display apparatus 1, a channel change button 325 to change a channel of a broadcast displayed through the image display apparatus 1, and a voice recognition button 327 to receive a voice recognition start command.

The input button 320 may include a switch such as a button-type switch or a membrane switch or a touch pad to sense touch of a part of a user's body. The switch and the touch pad may be used interchangeably. For example, the power button 321, the volume control button 323, and the channel change button 325 which are frequently used by the user may employ a touch pad and the voice recognition button 327 may employ a membrane switch.

The second voice input unit 312 receives a voice signal related to a control command from the user. The second voice input unit 312 may include a microphone to convert a sound wave into an electrical signal and may further include an amplifier to amplify the received voice signal and an analog/digital (A/D) converter to convert the voice signal into a digital signal.

Figure 6:
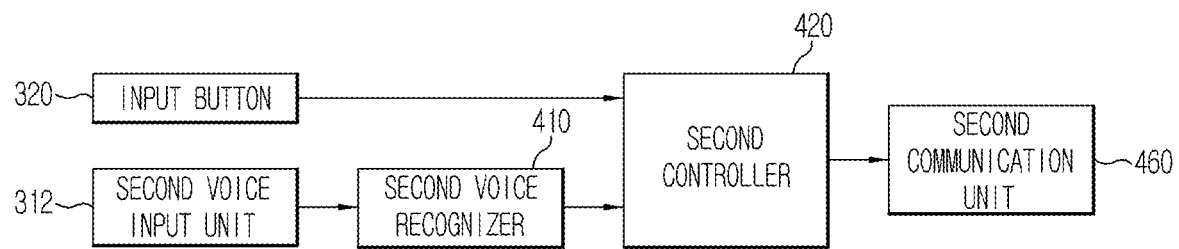
FIG. 6 is a block diagram showing a control flow of a remote controller included in an image display apparatus according to an exemplary embodiment.

FIG. 6 is a block diagram showing the control flow of the remote controller 300 included in the image display apparatus 1 according to an exemplary embodiment.

Referring to FIG. 6, the remote controller 300 includes an input button 320 to receive a control command from the user through touch or button manipulation, a second voice input unit 312 to receive a control command from the user through voice, a second voice recognizer 410 to identify a control command from the voice signal received through the second voice input unit 312, a second communication unit 460 (e.g., second communicator) to transmit a control signal to the image display apparatus main body 110, and a second controller 420 to control an overall operation of the remote controller 300.

The input button 320 and the second voice input unit 312 have been described with reference to FIG. 5 and thus a description thereof will be omitted herein.

The second communication unit 460 transmits a control signal to the image display apparatus main body 100. The second communication unit 460 may employ a wireless communication scheme such as a Wi-Fi communication scheme, a Bluetooth communication scheme, a ZigBee communication scheme, etc., or may employ a relatively simple infrared communication scheme.

The second controller 420 controls the second communication unit 460 according to the control command received through the input button 320 or the second voice recognizer 410 and transmits a control signal to the image display apparatus main body 100. More specifically, if an audio increase/decrease command or a channel change command is received through the input button 320, the audio increase/decrease command or the channel change command is transmitted to the image display apparatus main body 100 through the second communication unit 460.

If the voice recognition start command is received through the voice recognition button 327 provided in the input button 320, the voice recognition start command is transmitted to the image display apparatus main body 100 and a control command identified by the second voice recognizer 410 is transmitted to the image display apparatus main body 100 through the second communication unit 460. The voice recognition button 327 to receive the voice recognition start command from the user may be provided in the image display apparatus main body 100. In addition, the voice recognition start command may be received through a menu provided by the image display apparatus main body 100.

The first controller 220 provided in the image display apparatus main body 100 may decrease the volume of the audio signal output through the audio output unit 122 to a predetermined level if the voice recognition start command is received from the remote controller 300 or may decrease the volume of the audio signal output through the audio output unit 122 to a predetermined level if the control command is received from the remote controller 300 through voice.

In addition, if voice recognition ends, the second controller 420 transmits a voice recognition end command to the image display apparatus main body 100 through the second communication unit 460 and the image display apparatus main body 100 returns the volume of the audio signal output through the audio output unit to the original level. Voice recognition ends when the user inputs the voice recognition end command through the voice recognition button 327 or when a control command to be subjected to voice recognition is not received for a predetermined reference time.

As compared to the image display apparatus main body 100, since the remote controller 300 receives a voice command of the user at a relatively short distance, the remote controller 300 may not include a background sound canceller to cancel background sound. However, it is understood that one or more other exemplary embodiments are not limited thereto and the remote controller 300 may include a background sound canceller.

Hereinafter, a method of controlling an image display apparatus 1 according to an exemplary embodiment will be described.

Figure 7:
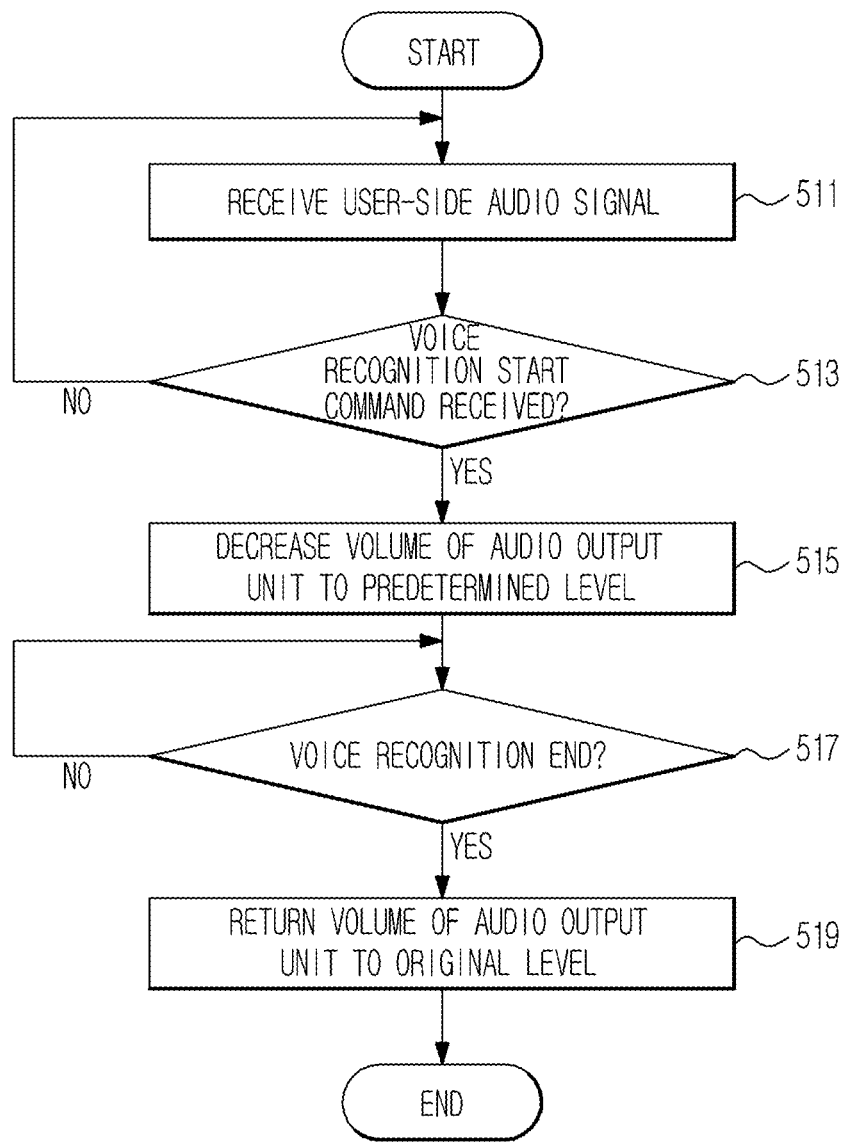
FIG. 7 is a flowchart illustrating a control method of an image display apparatus according to an exemplary embodiment.

FIG. 7 is a flowchart illustrating a control method of an image display apparatus 1 according to an exemplary embodiment.

Referring to FIG. 7, first, a user-side audio signal is received from a user through the first voice input unit 112 (operation 511). The user-side audio signal may include a user voice signal and an audio signal output through the audio output unit 122 of the image display apparatus 1.

A determination as to whether the received user-side audio signal represents a voice recognition start command is made (operation 513). That is, a determination as to whether the voice recognition start command has been received is made. More specifically, the voice recognizer 210 determines whether the received user-side audio signal matches a previously stored voice recognition start command word to determine whether the voice recognition start command has been received.

If it is determined that the received user-side audio signal represents the voice recognition start command (Yes of operation 513), then the volume of the audio output unit 122 is decreased to a predetermined level (operation 515). The predetermined volume level may be experimentally or statistically set in consideration of a voice recognition rate or may be set or changed by a user.

A determination as to whether voice recognition has ended is made (operation 517) and, if it is determined that the voice recognition has ended (Yes of operation 517), the volume of the audio output unit 122 is returned to the original level (operation 519).

Figure 8:
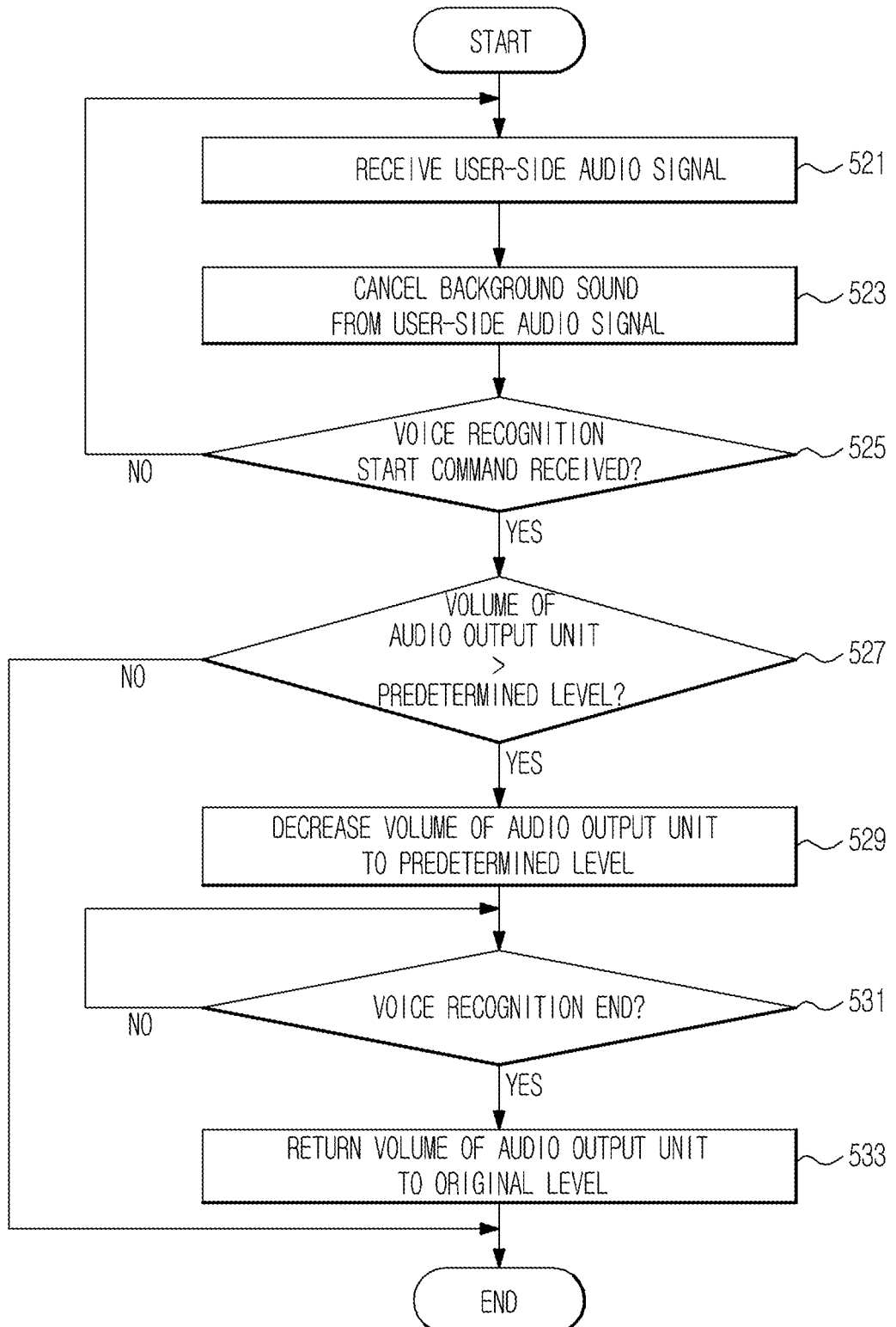
FIG. 8 is a flowchart illustrating the exemplary embodiment of FIG. 7 in greater detail.

FIG. 8 is a flowchart illustrating the exemplary embodiment of FIG. 7 in greater detail.

Referring to FIG. 8, first, a user-side audio signal is received from a user through the first voice input unit 112 (operation 521) and a background sound signal is cancelled from the received user-side audio signal (operation 523). The background sound signal may be an audio signal output through the audio output unit. An acoustic echo canceller (ACE) may be used to cancel background sound, receives a user-side audio signal as an input signal, and receives an audio signal output through the audio output unit 122 as a reference signal.

A determination 525 as to whether the voice recognition start command has been received is equal to that of FIG. 7.

If it is determined that the voice recognition start command has been received (Yes of operation 525), that is, if it is determined that the received user-side audio signal represents the voice recognition start command, a determination as to whether the current volume level of the audio output unit 122 exceeds a predetermined level is made (operation 527).

If it is determined that the current volume level of the audio output unit 122 exceeds the predetermined level (Yes of operation 527), the volume of the audio output unit 122 is decreased to the predetermined level (operation 529) and, if not, the current volume of the audio output unit 122 is maintained.

A determination as to whether voice recognition has ended is made (operation 531). The determination as to whether voice recognition has ended is made by determining whether the user inputs a voice recognition end command or whether a control command of a user is not received for a predetermined time. The voice recognition end command may be received through voice, manipulation of the input button included in the remote controller 300 or the image display apparatus main body 100, or motion recognition.

If it is determined that voice recognition has ended (Yes of operation 531), the volume of the audio output unit 122 is returned to the original level (operation 533). If the volume level of the audio output unit 122 is equal to or less than the predetermined level and thus is maintained when starting voice recognition, the volume level of the audio output unit 122 is maintained even when voice recognition ends.

Figure 9:
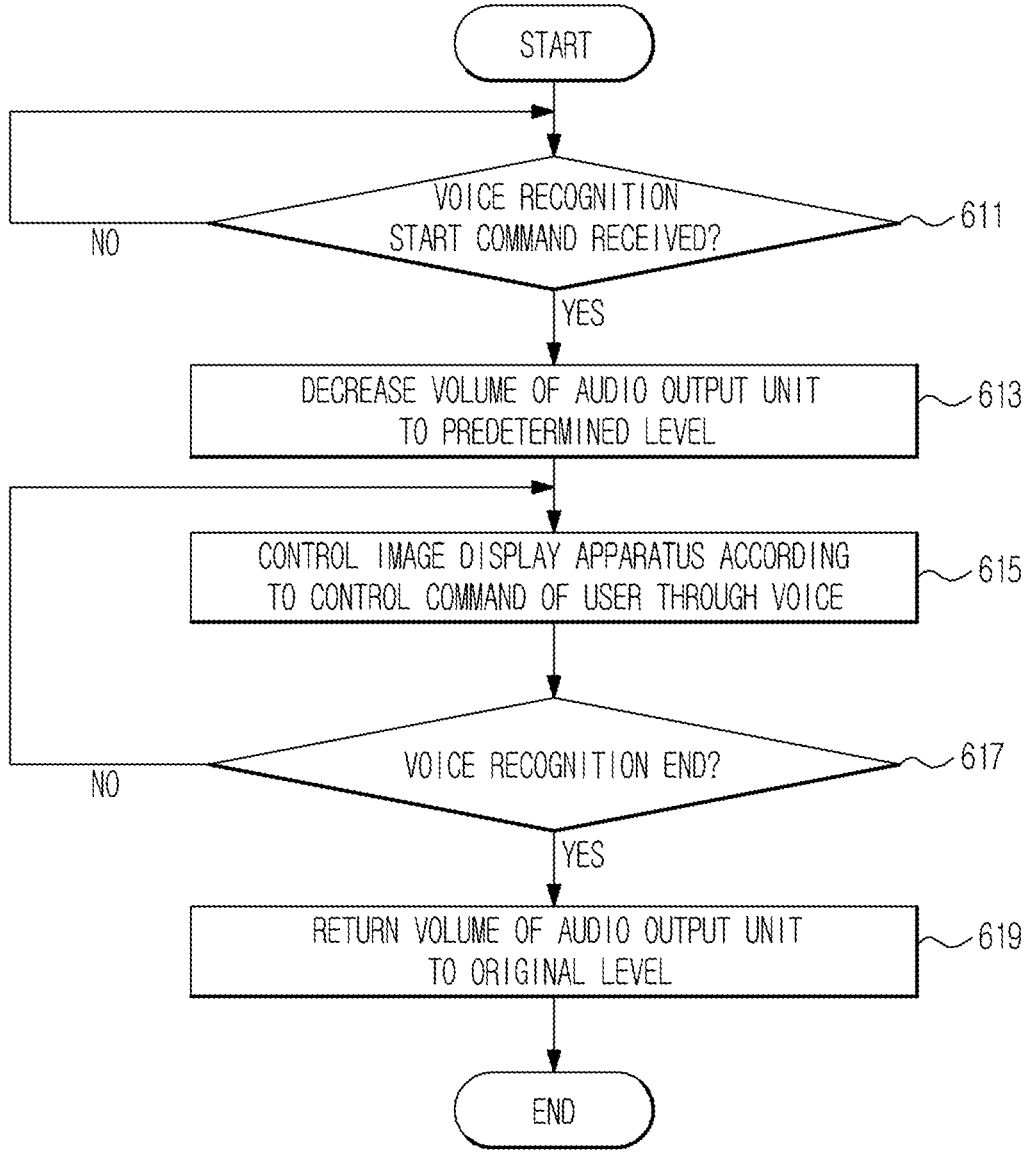
FIG. 9 is a flowchart illustrating a control method of an image display apparatus according to another exemplary embodiment.

FIG. 9 is a flowchart illustrating a control method of an image display apparatus 1 according to another exemplary embodiment.

Referring to FIG. 9, the image display apparatus 1 determines whether a voice recognition start command has been received (operation 611). More specifically, if a predefined voice recognition start command word (e.g., "Hi TV," "TV," etc.) is received through the first voice input unit 112 provided in the image display apparatus main body 100 or if the voice recognition start command is received through the voice recognition button 327 provided in the remote controller 300 or the voice recognition button provided in the image display apparatus main body 100, the image display apparatus 1 determines that the voice recognition start command has been received and enters the voice recognition mode. In addition, if voice having a predetermined volume or more is received through the second voice input unit 312 provided in the remote controller 300 or the first voice input unit 112 provided in the image display apparatus main body 100, the image display apparatus 1 determines that that the voice recognition start command has been received and enters the voice recognition mode.

If the voice recognition start command word is received through the voice input unit 112 provided in the image display apparatus main body 100, the image display apparatus 1 cancels a background sound signal other than the voice recognition start command word through the background sound canceller 270, thereby more accurately recognizing the voice recognition start command word received through the voice input unit 112.

If the voice recognition start command is received, the image display apparatus 1 decreases the volume of the audio output unit 122 to a predetermined volume level (operation 613). At this time, if the volume level of the audio output unit 122 is equal to or less than the predetermined volume level, an operation to decrease the volume of the audio output unit 122 of the image display apparatus 1 may not be performed.

Next, the image display apparatus 1 controls the broadcast signal receiver 230, the content execution unit 240, and the audio output unit 122 according to the voice control command of the user received through the voice input unit 121 (operation 615). Control of the image display apparatus according to the voice control command of the user will be described in detail with reference to FIG. 12.

Next, the image display apparatus 1 determines whether voice recognition ends (operation 617). For example, if the predefined voice recognition start command word (e.g., "Hi TV," "TV," etc.) is received again or a predefined voice recognition end command word is received through the first voice input unit 112 provided in the image display apparatus main body 100 or if the voice recognition button 327 provided in the remote controller 300 or the voice recognition button provided in the image display apparatus main body 100 is selected in the voice recognition mode, the image display apparatus 1 determines that the voice recognition end command has been received. In addition, if a control command is not received from the user through voice for a predetermined time, voice recognition ends. Ending of voice recognition because the control command is not received from the user through voice for the predetermined time will be described in detail with reference to FIG. 10.

If it is determined that voice recognition ends, the voice recognition mode of the image display apparatus 1 is released and the volume of the audio output unit 122 is returned to the original level (operation 619).

Figure 10:
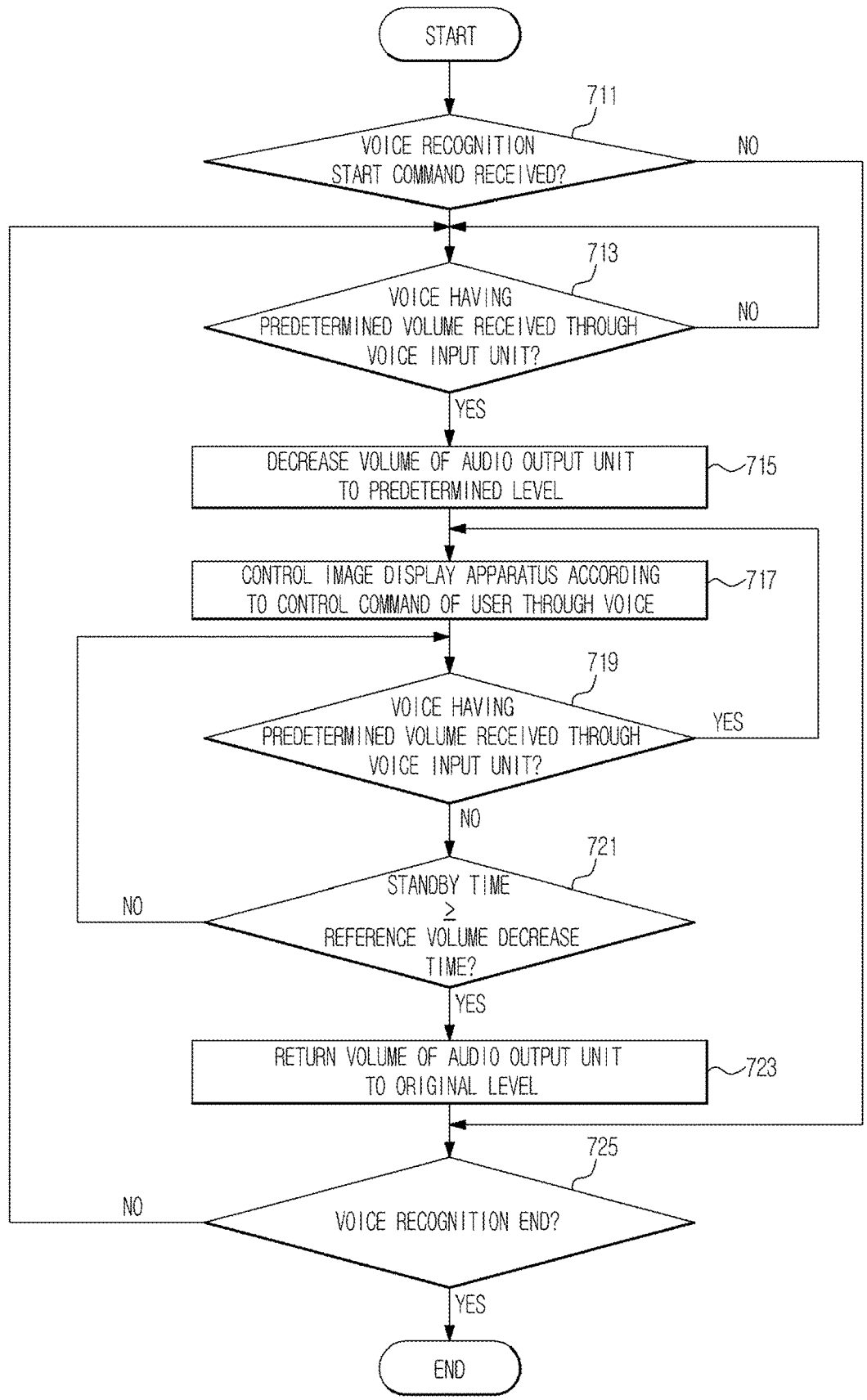
FIG. 10 is a flowchart illustrating a control method of an image display apparatus according to another exemplary embodiment.

FIG. 10 is a flowchart illustrating a control method of an image display apparatus 1 according to another exemplary embodiment.

Referring to FIG. 10, the image display apparatus 1 determines whether a voice recognition start command word has been received (operation 711). More specifically, if the predefined voice recognition start command word (e.g., "Hi TV," "TV," etc.) is received through the first voice input unit 112 provided in the image display apparatus main body 100, if the voice recognition start command is received through the voice recognition button 327 provided in the remote controller 300 or the voice recognition button provided in the image display apparatus main body 100, or if voice having a predetermined volume or more is received through the second voice input unit 312 provided in the remote controller 300 or the first voice input unit 112 provided in the image display apparatus main body 100, the image display apparatus 1 determines that the voice recognition start command has been received.

If the voice recognition start command has been received, the image display apparatus 1 determines whether voice having a predetermined volume or more has been received through the first voice input unit 112 or the second voice input unit 312 (operation 713).

If voice having a predetermined volume or more has been received, the image display apparatus 1 decreases the volume of the audio output unit 122 to a predetermined volume level (operation 715). That is, while the volume of the audio output unit 122 is immediately decreased when voice recognition begins in the control method of the exemplary embodiment illustrated in FIG. 9, the volume of the audio output unit 122 is decreased when a user inputs a control command through voice after voice recognition begins in the control method according to the present exemplary embodiment. Through such control, it is possible to ensure continuity of operation which is being performed by the user.

Next, the image display apparatus 1 controls the components included in the image display apparatus 1 according to the control command of the user through voice (operation 717).

Next, the image display apparatus 1 determines whether voice having a predetermined volume or more has been received again through the first voice input unit 112 or the second voice input unit 312 (operation 719).

If voice having a predetermined volume or more has been received, the image display apparatus 1 controls the components included in the image display apparatus 1 according to the control command of the user through voice (operation 717). However, if voice having a predetermined volume or more has not been received for a predetermined reference volume decrease time or more (operation 721), the image display apparatus 1 returns the volume of the audio output unit 122 to the original level.

That is, the image display apparatus 1 decreases the volume of the audio output unit 122 if voice having a predetermined volume or more is received after entering the voice recognition mode and returns the volume of the audio output unit 122 to the original level if a control command is not received through voice for a predetermined reference volume decrease time.

Next, the image display apparatus 1 determines whether voice recognition ends (operation 725).

Figure 11:
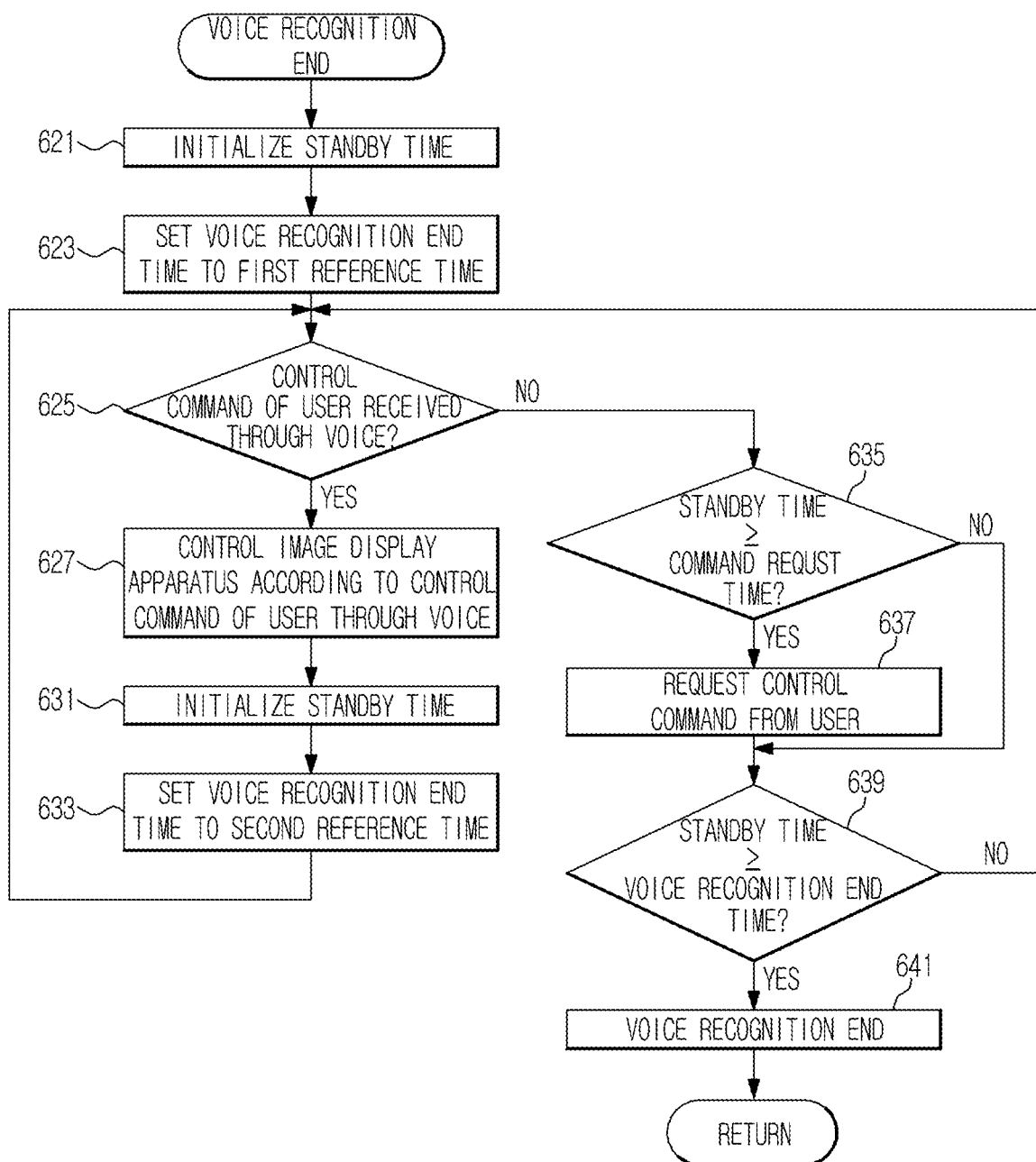
FIG. 11 is a flowchart illustrating a method of finishing voice recognition if a control command is not received from a user through voice for a predetermined time in FIG. 9, according to an exemplary embodiment.

FIG. 11 is a flowchart illustrating a method of finishing voice recognition if a control command is not received from a user through voice for a predetermined time, according to an exemplary embodiment.

As shown in FIG. 11, when the image display apparatus 1 enters a voice recognition mode, a standby time is initialized (operation 621) and a voice recognition end time is set to a first reference time (operation 623). The standby time refers to a time for which the image display apparatus 1 waits until a user inputs a control command through voice in a voice recognition mode. In addition, the first reference time refers to a time for which the image display apparatus 1 waits when a user does not input a control command after entering the voice recognition mode.

Thereafter, the image display apparatus 1 determines whether the control command of the user has been received through voice (operation 625).

If the control command of the user has been received through voice, the image display apparatus 1 controls the broadcast signal receiver 230, the content execution unit 240, and the audio output unit 122 according to the control command of the user (operation 627).

Thereafter, the image display apparatus 1 initializes a standby time (operation 631) and sets a voice recognition end time to a second reference time (operation 633). The second reference time refers to a time for which the image display apparatus 1 waits until a next control command of the user is received through voice after the image display apparatus 1 enters the voice recognition mode and the user inputs the control command through voice. Since time is consumed when the user inputs the control command and checks an operation of the image display apparatus 1, the second reference time may be greater than the first reference time. For example, if the first reference time is set to 30 seconds, the second reference time may be set to 60 seconds in consideration of the time for the user to check operation of the image display apparatus 1 according to the control command.

Thereafter, the image display apparatus 1 determines whether the control command of the user has been received again through voice (operation 625).

If the control command of the user has not been received through voice, the image display apparatus 1 determines whether the standby time exceeds a command request time (operation 635). The command request time refers to a predetermined time interval to request a control command from the user if the user does not input the control command through voice. The command request time may be shorter than the voice recognition end time, in order to request the control command from the user at least one time before voice recognition ends.

If the user does not input the control command through voice during the command request time, the image display apparatus 1 may output a message, e.g., "Please say a function," "Would you like to change channel?" or "Would you like to control volume?" through at least one of the video output unit 121 and the audio output unit 122, and requests the user to input the control command (operation 637).

Thereafter, the image display apparatus 1 determines whether the standby time exceeds the voice recognition end time (operation 639).

If the standby time of the image display apparatus 1, that is, the time for which the user does not input the control command through voice, is equal to or greater than the voice recognition end time, the image display apparatus 1 finishes voice recognition (operation 641).

Figure 12A:
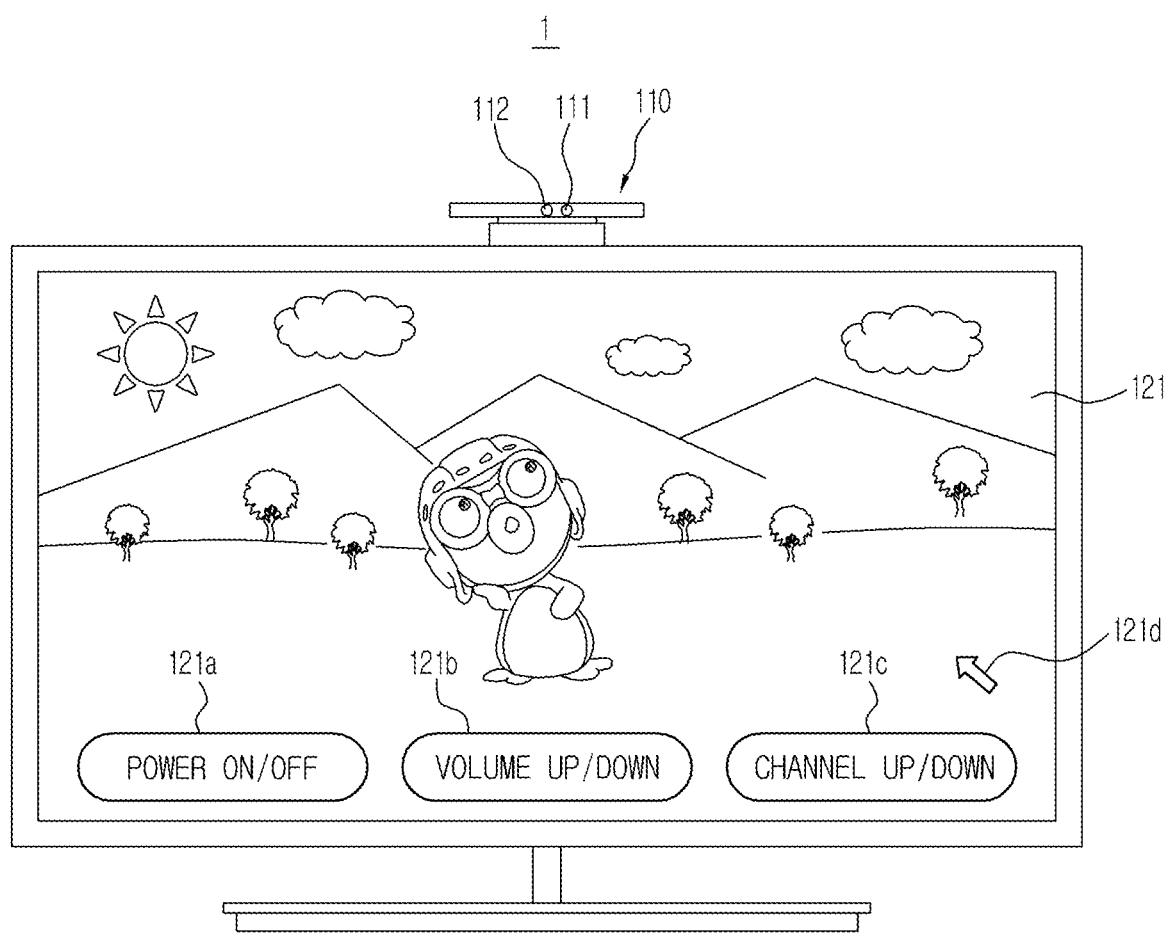

FIGS. 12A-12C are diagrams showing a screen displayed on a video output unit 121 if an image display apparatus 1 according to an exemplary embodiment is in a voice recognition mode.

Referring to FIG. 12A, control related icons are displayed at the lower side of the video output unit 121 and a main screen is displayed in the remaining region. Among the icons displayed at the lower side of the video output unit, a "power on/off" icon 121a corresponds to control commands "power on" and "power off," a "volume up/down" icon 121b corresponds to control commands "volume up" and "volume down," and a "channel up/down" icon 121c corresponds to control commands "channel up" and "channel down."

Although six icons corresponding to these control commands may be displayed in a related art display apparatus, the image display apparatus 1 according to the present exemplary embodiment may display only three icons to execute the six control commands.

If the user inputs a control command corresponding to power on or power off, a cursor displayed on the video output unit 121 is moved to the "power on/off" icon 121a and power is turned on or off according to the control command. The remaining icons 121b and 121c may be manipulated using a similar method.

Although all contents of one icon are displayed in FIGS. 12A-12C, only "volume" may be displayed with respect to a volume control icon, only "channel" may be displayed with respect to a channel control icon, and only "power" may be displayed with respect to a power control icon. The contents of the icon are not limited so long as the user can recognize which control is performed using the icon.

Power on and power off, volume up and volume down, and channel up and channel down may be executed in a toggle form. For example, if the user inputs a control command word corresponding to "channel up" through the first voice input unit 112, as shown in FIG. 12B, a cursor 121d is moved to the "channel up/down" icon 121c and the color of the "channel up/down" icon 121c may be changed to red in order to distinguish between a channel up command and a channel down command. If the user inputs a control command word corresponding to "channel down," as shown in FIG. 12C, a cursor 121d is moved to the "channel up/down" icon 121c and the color of the "channel up/down" icon 121c may be changed to blue.

As another example, if a control command word is received, an icon corresponding to the control command word may be flickered or, if a control command word corresponding to "channel up/down" or a control command word corresponding to "volume up/down" is received, a vertical bar may be generated in the icon to display a channel control amount or a volume control amount.

Although the cursor 121d is displayed on the video output unit 121 in FIGS. 12A-12C, it is understood that one or more other exemplary embodiments are not limited thereto and only the icon may be changed without displaying a cursor.

The image display apparatus 1 according to the present exemplary embodiment may change the icon using various methods in order to represent that the control command word corresponding to the icon is received. Icon change includes displaying a cursor in an icon. The embodiments of the present invention are not limited to the above-described examples.

Although only the icons related to power, channel, and volume control are shown in FIGS. 12A-12C, icons corresponding to various control commands such as web browser on/off, mute on/off, etc., may be displayed.

FIG. 13 is a flowchart illustrating a method of generating a command word by a user in an image display apparatus 1 according to an exemplary embodiment, and FIGS. 14A-14D are diagrams showing a screen displayed on a video output unit 121 if an image display apparatus 1 according to an exemplary embodiment generates a command word by a user. In the present exemplary embodiment, a voice recognition start command word is generated.

Referring to FIG. 13, first, a command word generation request is received from a user (operation 811). The command word generation request may be received through voice recognition or through manipulation of an input button included in the remote controller 300 or the image display apparatus main body 100 or through motion recognition. The method of inputting the command word generation request is not limited.

Figure 14A:
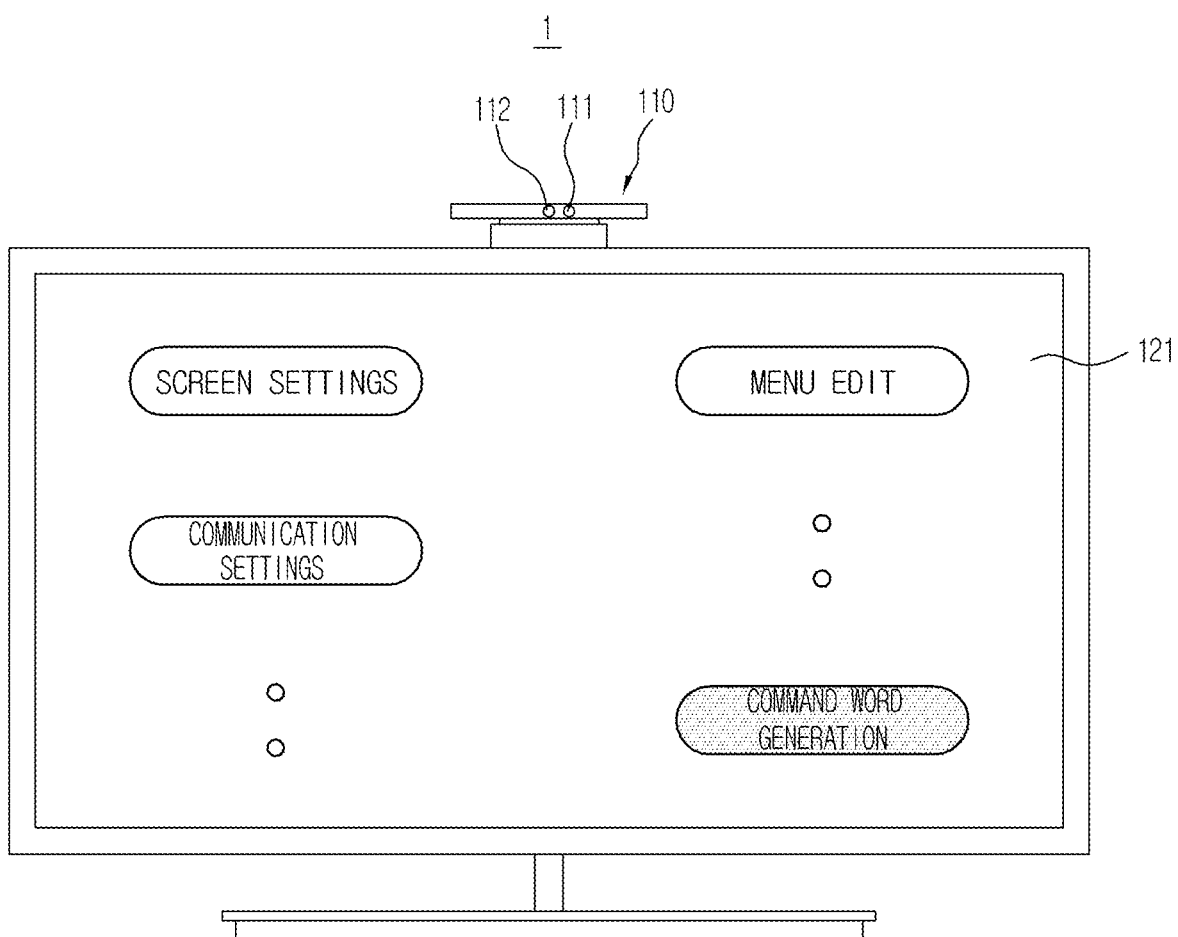

More specifically, as shown in FIG. 14A, first, the user selects a "command word generation" item among menu items related to environment settings. The "command word generation" item may also be selected through voice recognition or through manipulation of an input button included in the remote controller 300 or the image display apparatus main body 100 or through motion recognition.

Then, a candidate command word is received from the user (operation 813). The candidate command word may be received through the first voice input unit 112 as a voice signal.

More specifically, as shown in FIG. 14B, if a message, "Enter candidate command word," is displayed on the video output unit 121 of the image display apparatus 1, the user enters a candidate command word to be registered as a command word through the first voice input unit 112. For example, the user may enter a short word "mic" as the candidate command word.

If the candidate command word is received, it is tested whether the received candidate command word is suitable as the voice recognition start command word (operation 815). A short word capable of being easily voice-recognized is suitable as the voice recognition start command word. Therefore, it may be tested whether the candidate command word is suitable using various criteria and a voice recognition rate of the candidate command word may be measured.

More specifically, as shown in FIG. 14C, a message, "Test is being performed," is displayed on the video output unit 121.

If the candidate command word is suitable as the voice recognition start command word according to the test result (Yes of operation 817), the candidate command word is registered as the voice recognition start command word (operation 819) and is transmitted to the voice recognizer. In an exemplary embodiment, if the voice recognition rate of the candidate command word is equal to or greater than a predetermined reference value (e.g., 80%), it may be determined that the candidate command word is suitable as the voice recognition start command word.

If the candidate command word is not suitable as the voice recognition start command word as the test result (No of operation 817), as shown in FIG. 9, another candidate command word may be received from the user or command word generation may end according to user selection.

More specifically, if the test ends, as shown in FIG. 14D, the test result is displayed. For example, if the candidate command word is suitable for registration as the voice recognition start command, a message, "Registration Possible," is displayed on the video output unit 121. If the candidate command word is not suitable as the voice recognition start command word and thus a message, "Registration Not Possible," is displayed on the video output unit 121, the user may enter a new candidate command word again.

Although generation of the voice recognition start command word is described with reference to FIGS. 13 and 14A-14C, it is understood that one or more other exemplary embodiments are not limited thereto and are applicable to generation of other control commands. The video output unit 121 of the image display apparatus 1 may display various messages related to command word generation.

In exemplary embodiments, if the control command of the user is received through voice recognition, the user says a control command without taking an action such as pressing an input button, thereby conveniently executing a desired operation.

In addition, the icon corresponding to the control command is displayed on the video output unit 121. For example, a "channel up" icon, a "channel down" icon, a "volume up" icon, and a "volume down" icon may be displayed. In particular, since the icons are for operation of the image display apparatus 1, the icons are displayed in a part of the video output unit 121 when a main screen is displayed on the video output unit 121.

Since the size of the video output unit 121 is restricted, the number of displayable icons is restricted. The image display apparatus 1 according to another exemplary embodiment may display one icon corresponding to a plurality of control command words in order to efficiently manage the area occupied by the icons.

While the above-described exemplary embodiments are with reference to a display apparatus 1, it is understood that one or more other exemplary embodiments are not limited thereto. For example, other exemplary embodiments may be applicable to an audio/video receiver, a set-top box, a standalone device, etc., which is capable of performing, implementing, enabling, or controlling voice recognition and/or audio output.

While not restricted thereto, an exemplary embodiment can be embodied as computer-readable code on a computer-readable recording medium. The computer-readable recording medium is any data storage device that can store data that can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network-coupled computer systems so that the computer-readable code is stored and executed in a distributed fashion. Also, an exemplary embodiment may be written as a computer program transmitted over a computer-readable transmission medium, such as a carrier wave, and received and implemented in general-use or special-purpose digital computers that execute the programs. Moreover, it is understood that in exemplary embodiments, one or more units of the above-described apparatuses can include circuitry, a processor, a microprocessor, etc., and may execute a computer program stored in a computer-readable medium.

Although a few exemplary embodiments have been shown and described, it would be appreciated by those skilled in the art that changes may be made in these exemplary embodiments without departing from the principles and spirit of the inventive concept, the scope of which is defined in the claims and their equivalents.

What is claimed is:

1. An image display apparatus comprising:
a first audio receiver;
a display to display a content;
a first communicator to receive a control signal from a remote controller; and
a controller configured to:
in response to receiving a first audio input for starting a speech recognition from the first audio receiver, start the speech recognition, and
in response to a second audio input being received via the first audio receiver after the speech recognition is started, perform an operation according to the second audio input, and control the display to display a result of the operation,
wherein the remote controller is configured to control the image display apparatus and includes:
a button for controlling the image display apparatus to start the speech recognition,
a second audio receiver to receive a third audio input wherein the third audio input is received as a user voice via the second audio receiver of the remote controller, and
a second communicator to communicate with the image display apparatus and to transmit the control signal to the image display apparatus,
wherein in response to the button of the remote controller being pressed while the image display apparatus waits to receive a user voice via the first audio receiver after the speech recognition is started by the first audio input to the first audio receiver of the image display apparatus, the controller is further configured to end the speech recognition started by the first audio input.

2. The image display apparatus according to claim 1, wherein the controller is configured to, in response to receiving the first audio input for starting the speech recognition from the first audio receiver, initialize a standby time, and
in response to no audio input for speech recognition being received via the first audio receiver until the standby time reaches a first reference time after the start of the speech recognition, end the speech recognition started by the first audio input.

3. The image display apparatus according to claim 2, wherein the controller is configured to, in response to the second audio input for speech recognition being received via the first audio receiver before the standby time reaches the first reference time after the start of the speech recognition, initialize the standby time.

4. The image display apparatus according to claim 1, further comprising an audio output unit to output an audio signal,
wherein the controller is configured to, in response to receiving the first audio input for starting the speech recognition, decrease a volume of the audio signal output through the audio output unit to a predetermined level.

5. The image display apparatus according to claim 4, wherein the predetermined level is not zero level.

6. The image display apparatus according to claim 4, wherein the controller is configured to,
in response to receiving the first audio input for starting the speech recognition from the first audio receiver, initialize a standby time, and
in response to no audio input for speech recognition being received via the first audio receiver until the standby time reaches the first reference time after the start of the speech recognition, restore the volume of the audio signal output through the audio output unit to a volume level set before the speech recognition starts.

7. The image display apparatus according to claim 1, further comprising an audio output unit to output an audio signal, wherein the controller is configured to:
in response to receiving the first audio input for starting the speech recognition from the first audio receiver, decrease a volume of the audio signal output through the audio output unit to a predetermined level and initialize a standby time,
after displaying the result of the operation according to the second audio input on the display, re-start the speech recognition for receiving a fourth audio input for speech recognition associated with the result and initialize the standby time,
in response to no audio input for speech recognition being received via the first receiver until the standby time reaches a second reference time after displaying the result on the display, end the speech recognition and restore the volume of the audio signal output through the audio output unit to a volume level set before the speech recognition starts.

8. The image display apparatus according to claim 7, wherein the second reference time is different from the first reference time.

9. The image display apparatus according to claim 7, wherein the second reference time is longer than the first reference time.

10. The image display apparatus according to claim 1, further comprising a background sound canceller to cancel background sound other than the user voice from the first audio receiver.

11. A non-transitory computer-readable medium storing computer-executable instructions when executed by at least one processor of an image display apparatus, cause the image display apparatus to perform:
in response to receiving a first audio input for starting a speech recognition from a first audio receiver of the image display apparatus, starting the speech recognition,
in response to a second audio input being received via the first audio receiver after the speech recognition is started, performing an operation according to the second audio input, and controlling a display of the image display apparatus to display a result of the operation, and
in response to a button of a remote controller being pressed while the image display apparatus waits to receive a user voice via the first audio receiver after the speech recognition is started by the first audio input to the first audio receiver of the image display apparatus, ending the speech recognition started by the first audio input,
wherein the remote controller is configured to control the image display apparatus, and the button of the remote controller is configured to control the image display apparatus to start the speech recognition,
wherein the remote controller includes:
a second audio receiver to receive a third audio input wherein the third audio input is received as a user voice via the second audio receiver of the remote controller, and
a communicator to communicate with the image display apparatus and to transmit a control signal to the image display apparatus.

12. The non-transitory computer-readable medium according to claim 11, wherein when executed by the at least one processor of the image display apparatus, the instructions cause the image display apparatus to further perform:
in response to receiving the first audio input for starting the speech recognition from the first audio receiver, initializing a standby time, and
in response to no audio input for speech recognition being received via the first audio receiver until the standby time reaches a first reference time after the start of the speech recognition, ending the speech recognition started by the first audio input.

13. The non-transitory computer-readable medium according to claim 12, wherein when executed by the at least one processor of the image display apparatus, the instructions cause the image display apparatus to further perform:
in response to the second audio input for speech recognition being received via the first audio receiver before the standby time reaches the first reference time after the start of the speech recognition, initializing the standby time.

14. The non-transitory computer-readable medium according to claim 11, wherein when executed by the at least one processor of the image display apparatus, the instructions cause the image display apparatus to further perform:
in response to receiving the first audio input for starting the speech recognition, decreasing a volume of an audio signal output through an audio output unit of the image display apparatus to a predetermined level.

15. The non-transitory computer-readable medium according to claim 14, wherein the predetermined level is not zero level.

16. The non-transitory computer-readable medium according to claim 14, wherein when executed by the at least one processor of the image display apparatus, the instructions cause the image display apparatus to further perform:
in response to receiving the first audio input for starting the speech recognition from the first audio receiver, initializing a standby time, and
in response to no audio input for speech recognition being received via the first audio receiver until the standby time reaches the first reference time after the start of the speech recognition, restoring the volume of the audio signal output through the audio output unit to a volume level set before the speech recognition starts.

17. The non-transitory computer-readable medium according to claim 11, wherein when executed by the at least one processor of the image display apparatus, the instructions cause the image display apparatus to further perform:
in response to receiving the first audio input for starting the speech recognition from the first audio receiver, decreasing a volume of an audio signal output through an audio output unit to a predetermined level and initializing a standby time,
after displaying the result of the operation according to the second audio input on the display, re-starting the speech recognition for receiving a fourth audio input for speech recognition associated with the result and initializing the standby time,
in response to no audio input for speech recognition being received via the first receiver until the standby time reaches a second reference time after displaying the result on the display, ending the speech recognition and restoring the volume of the audio signal output through the audio output unit to a volume level set before the speech recognition starts.

18. The non-transitory computer-readable medium according to claim 17, wherein the second reference time is different from the first reference time.

19. The non-transitory computer-readable medium according to claim 17, wherein the second reference time is longer than the first reference time.

20. The non-transitory computer-readable medium according to claim 11, wherein when executed by the at least one processor of the image display apparatus, the instructions cause the image display apparatus to further perform:
controlling a background sound canceller of the image display apparatus to cancel background sound other than the user voice from the first audio receiver.

21. A method of controlling an image display apparatus, the method comprising:
in response to receiving a first audio input for starting a speech recognition from a first audio receiver of the image display apparatus, starting the speech recognition,
in response to a second audio input being received via the first audio receiver after the speech recognition is started, performing an operation according to the second audio input, and controlling a display of the image display apparatus to display a result of the operation, and
in response to a button of a remote controller being pressed while the image display apparatus waits to receive a user voice via the first audio receiver after the speech recognition is started by the first audio input to the first audio receiver of the image display apparatus, ending the speech recognition started by the first audio input,
wherein the remote controller is configured to control the image display apparatus, and the button of the remote controller is configured to control the image display apparatus to start the speech recognition,
wherein the remote controller includes:
a second audio receiver to receive a third audio input wherein the third audio input is received as a user voice via the second audio receiver of the remote controller, and
a communicator to communicate with the image display apparatus and to transmit a control signal to the image display apparatus.

22. The method according to claim 21, further comprising:
in response to receiving the first audio input for starting the speech recognition from the first audio receiver, initializing a standby time, and
in response to no audio input for speech recognition being received via the first audio receiver until the standby time reaches a first reference time after the start of the speech recognition, ending the speech recognition started by the first audio input.

23. The method according to claim 22, further comprising:
in response to the second audio input for speech recognition being received via the first audio receiver before the standby time reaches the first reference time after the start of the speech recognition, initializing the standby time.

24. The method according to claim 21, further comprising:
in response to receiving the first audio input for starting the speech recognition, decreasing a volume of an audio signal output through an audio output unit of the image display apparatus to a predetermined level.

25. The method according claim 24, wherein the predetermined level is not zero level.

26. The method according to claim 24, further comprising:
in response to receiving the first audio input for starting the speech recognition from the first audio receiver, initializing a standby time, and
in response to no audio input for speech recognition being received via the first audio receiver until the standby time reaches the first reference time after the start of the speech recognition, restoring the volume of the audio signal output through the audio output unit to a volume level set before the speech recognition starts.

27. The method according to claim 21, further comprising:
in response to receiving the first audio input for starting the speech recognition from the first audio receiver, decreasing a volume of an audio signal output through an audio output unit to a predetermined level and initializing a standby time,
after displaying the result of the operation according to the second audio input on the display, re-starting the speech recognition for receiving a fourth audio input for speech recognition associated with the result and initializing the standby time,
in response to no audio input for speech recognition being received via the first receiver until the standby time reaches a second reference time after displaying the result on the display, ending the speech recognition and restoring the volume of the audio signal output through the audio output unit to a volume level set before the speech recognition starts.

28. The method according to claim 27, wherein the second reference time is different from the first reference time.

29. The method according to claim 27, wherein the second reference time is longer than the first reference time.

30. The method according to claim 21, further comprising:
controlling a background sound canceller of the image display apparatus to cancel background sound other than the user voice from the first audio receiver.

\* \* \* \* \*